US006462587B2

(12) United States Patent
Yano

(10) Patent No.: US 6,462,587 B2
(45) Date of Patent: *Oct. 8, 2002

(54) INTEGRATED CIRCUIT HAVING A COMPARATOR CIRCUIT INCLUDING AT LEAST ONE DIFFERENTIAL AMPLIFIER

(75) Inventor: Yukio Yano, Kanagawa (JP)

(73) Assignee: Fuji Electric Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/824,221

(22) Filed: Apr. 3, 2001

(65) Prior Publication Data

US 2001/0010479 A1 Aug. 2, 2001

Related U.S. Application Data

(63) Continuation of application No. 08/308,426, filed on Sep. 19, 1994, now Pat. No. 6,320,429, which is a continuation-in-part of application No. 07/904,648, filed on Jun. 26, 1992, now abandoned.

(30) Foreign Application Priority Data

Jun. 28, 1991 (JP) .............................................. 3-158222

(51) Int. Cl.[7] .......................... H03K 5/153; H03K 5/22
(52) U.S. Cl. ............................ 327/89; 327/77; 327/52; 327/65
(58) Field of Search ................. 327/77–81, 85, 327/88, 89, 63, 65, 51–57

(56) References Cited

U.S. PATENT DOCUMENTS

| 4,439,694 A | * | 3/1984 | Fox ................................ 327/65 |
| 4,634,905 A | * | 1/1987 | Campbell Jr. ............... 327/143 |
| 4,885,477 A | * | 12/1989 | Bird et al. ..................... 327/52 |
| 5,440,272 A | * | 8/1995 | Orisaka et al. .............. 330/253 |

* cited by examiner

Primary Examiner—Toan Tran
(74) Attorney, Agent, or Firm—Finnegan, Henderson, Farabow, Garrett & Dunner LLP

(57) ABSTRACT

An integrated circuit including a comparator circuit and a vertical voltage control switch element formed on a single substrate. The comparator circuit including a differential amplifier circuit having a current mirror circuit M, a differential amplifier circuit $D_1$ with two current paths $L_1$ and $L_2$, and an inverter INV. The output section of the current mirror circuit M is used as a constant current source for the differential amplifier circuit. The current mirror circuit M includes a load MOS transistor 1, a MOS transistor 2 constituting an input section, and a MOS transistor 10 constituting an output section. The current path $L_1$ of the differential amplifier circuit $D_1$ includes a load MOS transistor 11, an amplifying depletion type MOS transistor 13, and an input terminal in1. Similarly, the current path $L_2$ includes a load MOS transistor 12, an amplifying depletion type MOS transistor 14, and an input terminal in2. The inverter INV is constructed with a load MOS transistor 3 and a switching transistor 4.

33 Claims, 17 Drawing Sheets

INTEGRATED CIRCUIT HAVING A COMPARATOR CIRCUIT INCLUDING AT LEAST ONE DIFFERENTIAL AMPLIFIER

CROSS REFERENCE TO RELATED APPLICATIONS

This is a continuation of application Ser. No. 08/308,426, filed Sep. 19, 1994 now U.S. Pat. No. 6,320,429, which is a continuation-in-part of Ser No. 07/904,648, filed Jun. 26, 1992 now abandoned, which are incorporated herein by reference.

BACKGROUND OF THE INVENTION

1. Field of the Invention

The present invention relates to an integrated circuit having a comparator circuit including at least one differential amplifier, and more particularly to an integrated circuit having a comparator, which is adaptable for a 1-bit A/D convertor or a digitizing circuit for translating the output signals of sensors, entering keys, or the like, and delivering a control signal to a switch for controlling a load.

2. Discussion of the Related Art

Output signals received from sensors, entering keys, or the like, which are treated as digital signals, may be considered to be, in the strict sense, analog signals having gentle rise profiles. Before such output signals are supplied to post-processing by a microcomputer, for example, the output signals must be converted into normal digital signals (binary logic signals) with high precision by a 1-bit A/D converter or a quantizing circuit. It is a common practice to use a buffer circuit for the digitizing circuit or the quantizing circuit. The buffer circuit has a unique threshold value. Because of this, the timing of changes in the logic level of the digital signal is unconditionally determined and fixed by the threshold value of the buffer circuit. As a result, it is impossible to adjust the rise point and the fall point of the digital signal. To cope with this, it is desirable to use a comparator constructed using a differential amplifier circuit of high gain. In this respect, there has been demanded the development of a semiconductor integrated circuit containing a plurality of comparators of that type in order to digitize a plurality of signals.

A conventional comparator using a high-gain differential amplifier circuit is shown in FIG. 12. As shown, the comparator is made up of a current mirror circuit M, a differential amplifier circuit $S_1$ with two current paths $L_1$ and $L_2$, and an inverter INV. The output section of the current mirror circuit operates as a constant current source for the differential amplifier circuit.

A drain current $i_0$ of an enhancement type (E-type) MOS transistor 2 flows, as a reference current, from a voltage source $V_{DD}$ to the input section of the current mirror circuit M, through a load MOS transistor 1 of the depletion type (D-type). A drain current $i_3$, which depends on the reference current $i_0$, flows through an E-type MOS transistor 10 in the output section.

In the first current path $L_1$ of the differential amplifier circuit $S_1$, a drain current $i_1$ flows from the voltage source $V_{DD}$ and passes through a D-type MOS transistor 11, which serves as a load transistor, and an E-type MOS transistor 15, which serves as an amplifying transistor. In the second current path $L_2$, a drain current $i_2$ flows from the voltage source $V_{DD}$ and passes through a D-type MOS transistor 12, which serves as a load transistor, and an E-type MOS transistor 16, which serves as an amplifying transistor. The gates of the amplifying transistors 15 and 16 are respectively connected to input terminals in1 and in2 as the input terminals of the differential amplifier circuit $S_1$. The current paths $L_1$ and $L_2$ are connected to the output section (as a constant current source) of the current mirror circuit M. Accordingly, the following equation holds:

$$i_3 = i_1 + i_2 \quad (1)$$

When the voltage applied to the input terminal in1 is equal to the voltage applied to the input terminal in2, the following equation holds:

$$i_1 = i_2 = i_3/2 \quad (2)$$

Under this condition, the differential amplifier circuit $S_1$ is in a balanced state.

When the voltage (input voltage $V_{in}$) applied to the input terminal in2 is higher than the voltage (reference voltage $V_{ref}$) applied to the input terminal in1 the current $i_2$ flowing through the MOS transistor 16 is increased by an increment $\Delta i$, which depends on the difference between the input voltages. Correspondingly, the current $i_1$ flowing into the MOS transistor 15 is decreased by $\Delta i$, as seen from the equation (1). A voltage drop across the load transistor 12 increases and the source potential (potential at node 102) consequently drops.

When the input voltage $V_{in}$ is lower than the reference voltage $V_{ref}$, the voltage drop across the load transistor 12 decreases and the source potential (potential at node 102) rises. Accordingly, the potential (at node 102) of the load transistor 12 is the amplified voltage, which depends on the difference between the voltages applied to the input terminals in1 and in2, with the balancing voltage being the voltage drop caused by the balancing current ($i_3/2$).

The inverter INV is made up of a MOS transistor 4, which serves as a switching element, and a MOS transistor 3, which serves as a load transistor, wherein both the MOS transistor 3 and the MOS transistor 4 are connected in series. The gate of the MOS transistor 4 receives the output voltage (differential amplifier voltage) $V_{102}$ present at the node 102. The inverter INV produces a digitized signal $V_{OUT}$ as a binary signal having a high or low logic level which depends on the amplitude of the input voltage $V_{in}$ relative to that of the reference voltage $V_{ref}$. As recalled, the input voltage $V_{in}$ is applied to the input terminal in2 and the reference voltage $V_{ref}$ to the input terminal in1.

FIG. 13(a) is a graph showing variations of the input potentials ($V_{in}$ and the reference voltage $V_{ref}$) of the differential amplifier circuit $S_1$ with respect time t wherein the reference voltage $V_{ref}$ at the input terminal in1 is higher than the respective threshold voltages $V_{th15}$ and $V_{th16}$ of the amplifying transistors 15 and 16. At point A, the reference voltage $V_{ref}$ is equal to the input voltage $V_{in}$ ($V_{ref} = V_{in}$). At point P, the input voltage $V_{in}$ is equal to the threshold voltages $V_{th15}$ and $V_{th16}$. FIG. 13(b) is a graph showing variations of the output voltages (voltage $V_{101}$, at node 101 and voltage $V_{102}$ at node 102) of the differential amplifier circuit $S_1$ with respect to units of time t corresponding to the units of time of FIG. 13(a) wherein the input voltages of differential amplifier circuit $S_1$ are those shown in FIG. 13(a). A line consisting of alternating long and two short dashes indicates the threshold voltage $V_{th4}$ of the MOS transistor 4. Point B indicates a voltage balanced state ($V_{101} = V_{102}$), which corresponds to the voltage balanced state at point A. At point C, the voltage $V_{102}$ at the node 102 is equal to the threshold voltage $V_{th4}$.

When the input voltage $V_{in}$ is lower than the threshold voltages $V_{th15}$ and $V_{th16}$, the amplifying MOS transistor 16 is in an off state, and the amplifying MOS transistor 15 is in an on state. The node 102 is pulled up to the source potential $V_{DD}$, and the voltage $V_{101}$ at the node 101 is in the lowest level $V_{LOW}$. When the input voltage $V_{in}$ exceeds the threshold voltages $V_{th15}$ and $V_{th16}$, the amplifying MOS transistor 16 is also turned on, a normal differentially amplified output signal is present at the nodes 101 and 102. When the input voltage $V_{in}$ is lower than the threshold voltages $V_{th15}$ and $V_{th16}$, the output signal of the differential amplifier circuit $S_1$, in the strict sense, is not the output signal when the differential amplifier circuit operates as a linear differential amplifier. However, this is not problematic in the digitizing operation because under this condition, the amplifier circuit has output characteristics which depend upon the input voltage difference.

In the case where the input voltage $V_{in}$ is lower than the threshold voltages $V_{th15}$ and $V_{th16}$, the circuit shown in FIG. 12 exhibits the following problems. FIG. 14(a) is a graph showing variations of the input potentials ($V_{in}$ and the reference voltage $V_{ref}$) of the differential amplifier circuit $S_1$ with respect to time t wherein the reference voltage $V_{ref}$ at the input terminal in1 is lower than the threshold voltages $V_{th15}$ and $V_{th16}$ of the amplifying transistors 15 and 16. At point A, the reference voltage $V_{ref}$ is equal to the input voltage $V_{in}$. At point P. the input voltage $V_{in}$ is equal to the threshold voltages $V_{th15}$ and $V_{th16}$. FIG. 14(b) is a graph showing variations of the output voltages (voltage $V_{101}$ at node 101 and voltage $V_{102}$ at node 102) of the differential amplifier circuit $S_1$ with respect to units of time t corresponding to the units of time of FIG. 14(a) wherein the input voltages $V_{in}$ and $V_{ref}$ of differential amplifier circuit $S_1$ are those shown in FIG. 14(a). When the input voltage $V_{in}$ is lower than the threshold voltages $V_{th15}$ and $V_{th16}$, the amplifying MOS transistors 16 and 15 are both in an off state. Accordingly, the nodes 101 and 102 are both pulled up to the source potential $V_{DD}$. When the MOS transistors 16 and 15 are both inoperable in this low level region, and there is a voltage difference present between the input voltage $V_{in}$ and the reference voltage $V_{ref}$, a differentially amplified output signal based on the voltage difference cannot be obtained. In other words, when the reference voltage $V_{ref}$ is set to be lower than the threshold voltages $V_{th15}$ and $V_{th16}$, the differential amplifier circuit loses its differential amplifying function for the input voltage $V_{in}$ within the low level region, and consequently it loses its digitizing function.

FIG. 13(c) is a graph showing variations of the output voltage $V_{OUT}$ of the inverter INV with respect to units of time t corresponding to the units of time of FIGS. 13(a) and 13(b) wherein the input voltages $V_{in}$ and $V_{ref}$ of differential amplifier circuit $S_1$ are those shown in FIG. 13(a) and wherein the reference voltage $V_{ref}$ at the input terminal in1 is higher than the threshold voltages $V_{th15}$ and $V_{th16}$ of the amplifying transistors 15 and 16. When the input voltage $V_{in}$ rises from ground potential, the voltage $V_{102}$ at the node 102 falls, as seen from FIG. 13(b). When the voltage $V_{102}$ falls and its locus crosses the level of the threshold voltage $V_{th4}$ (point C) of the MOS transistor 4, the output voltage $V_{OUT}$ of the inverter INV rises from a low potential level (referred to as an L level) to a high potential level (referred to as an H level). The balancing potential (point B) of the differential amplifier circuit $S_1$ is determined by the element characteristics of the differential amplifier circuit $S_1$. The threshold voltage $V_{th4}$ (point C) is a property of the MOS transistor 4 of the subsequent stage which depends, for example, on the semiconductor fabricating process used to produce MOS transistor 4. Therefore, the points B and C are generally not coincident with each other in position, and it is almost impossible to coincide point B with point C. For this reason, the logic level of the $V_{OUT}$ remains unchanged until the input voltage $V_{in}$ exceeds the reference voltage $V_{ref}$ plus an offset voltage $V_{off2}$. Presence of the offset voltage $_{off2}$ owing to the threshold voltage of the inverter INV brings about retardation (phase delay) of the rise or advancement (phase advancement) of the fall of the output digital signal with respect to the input voltage $V_{in}$, and formation of an insensitive region for digitalization.

FIG. 14(c) is a graph showing variations of the output voltage $V_{OUT}$ of the inverter INV with respect to units of time t corresponding to the units of time of FIGS. 14(a) and 14(b) wherein the input voltages $V_{in}$ and $V_{ref}$ of differential amplifier circuit $S_1$ are those shown in FIG. 14(a) and wherein the reference voltage $V_{ref}$ at the input terminal in1 is lower than the threshold voltages $V_{th15}$ and $V_{th16}$ of the amplifying transistors 15 and 16. Since the reference voltage $V_{ref}$ is lower than the threshold voltage $V_{th15,16}$ of the amplifying MOS transistor 15, the transistor is always in an off state. When the input voltage $V_{in}$ rises from the ground potential, and reaches the threshold voltage $V_{th15,16}$, the MOS transistor 16 is turned on and the output voltage $V_{102}$ at the node 102 becomes a low voltage $V_{LOW}$. The transistor 4 connected to the node 102 is then turned on, so that the output voltage $V_{OUT}$ of the inverter INV rises from an L level to an H level. Although the output voltage $V_{OUT}$ takes a digital form, the logic level changing point of the output voltage is determined by the threshold voltages $V_{th15,16}$ which are properties of the MOS transistors. When the input voltage $V_{in}$ exceeds the reference voltage $V_{ref}$, the logic state of the output voltage $V_{OUT}$ remains unchanged. When the input voltage $V_{in}$ exceeds the reference voltage $V_{ref}$ plus an offset voltage $V_{off1}$, the output voltage $V_{OUT}$ changes. Presence of the offset voltage $V_{off1}$ owing to the threshold voltage of the differential amplifier circuit $S_1$ also brings about retardation (phase delay) of the rise or advancement (phase advancement) of the fall of the output digital signal with respect to the input voltage $V_{in}$, and formation of an insensitive region for digitalization.

The dependency of the offset voltage $V_{off2}$ on the reference voltage $V_{ref}$ now will be described. First, consider the balancing potential of the amplifying voltages $V_{101}$ and $V_{102}$ at which the references voltage $V_{ref}$ is equal to the input voltage $V_{in}$, and the differential amplifier circuit $S_1$ is in a balanced state. In the current path $L_1$ of the differential amplifier circuit $S_1$ shown in FIG. 12, when the reference voltage $V_{ref}$ increases, the impedance of the MOS transistor 15 decreases. At this time, in order to compensate for a fixed balancing current ($i_3/2$) flowing through the MOS transistor 10, which serves as the constant current source, the impedance of the load transistor 11 increases. As a result, the voltage drop across the load transistor 11 increases, and the potential $V_{101}$ at the node 101 falls. Accordingly, as the reference voltage $V_{ref}$ increases, the amplified voltages $V_{101}$ and $V_{102}$ decrease. That is, the balancing potential is varied. Accordingly, as shown in FIG. 13(a), when the reference voltage $V_{ref}$ is at first higher than the threshold voltages $V_{th15}$ and $V_{th16}$ of the MOS transistors 15 and 16, and then is decreased, the voltage at point A ($V_{in}=V_{ref}$) drops. With this, the potential at point B ($V_{101}=V_{102}$) which represents the balancing potential of the differential amplifier circuit $S_1$, also changes. When the balancing potential at point B changes, the offset voltage $V_{off2}$, which represents a voltage to be added to the one of the input voltages $V_{in}$ or $V_{ref}$ such that the output voltage $V_{OUT}$ changes logic levels when at a time when $V_{in}=V_{ref}$, also changes. Thus, the offset voltage $V_{off2}$ depends on the reference voltage $V_{ref}$ of the differential amplifier circuit $S_1$. In other words, $V_{off2}$ cannot be determined by only the threshold voltage of the inverter INV. This fact implies that when the reference voltage $V_{ref}$ is lowered to approach to the threshold voltage $V_{th15,16}$ in order to operate the differential amplifier circuit in the low level region, the retardation (phase delay) of the rise of the output digitized signal with respect to the input voltage $V_{in}$, and the like increase, impairing the digitalization precision.

FIG. 15 shows an integrated circuit 400 having a comparator circuit 405 for controlling a switch element 410, which either permits or prevents a load current from flowing through a load 420, which may consist of a coil, via a voltage source 421. Typically, switch element 410 is a vertical voltage control switch element, such as a power MOSFET that may consist of an n channel DMOS (NDMOS).

When utilizing a conventional comparator circuit, such as that shown in FIG. 12, as the comparator circuit 405 in the integrated circuit 400 shown in FIG. 15, a problem arises due to the presence of PMOS and NMOS transistors in the conventional self-isolation CMOS comparator circuit.

FIG. 16 shows a cross-section of integrated circuit 450 constructed utilizing a comparator circuit 455 including both PMOS (460) and NMOS (470) transistors and a vertical voltage control switch element 480 all formed on an n⁻ epitaxial layer 490, which is formed on an n⁺ substrate 491. PMOS transistor 460 includes p-type source and drain diffusion layers 462 formed in the surface of n⁻ epitaxial layer 490, and a gate electrode 465 formed on a gate insulation film (not shown) bridging source and drain diffusion layers 462. NMOS transistor 470 includes a p-type base layer 471 formed in the surface of n⁻ epitaxial layer 490, n-type source and drain diffusion layers 472 formed in the surface of p-type base layer 471, and a gate electrode 475 formed on a gate insulation film (not shown) bridging source and drain diffusion layers 472. Vertical voltage control switch element 480 includes a p-type base layer 481 formed in the surface of n⁻ epitaxial layer 490, n-type source diffusion layers 482 formed in the surface of p-type base layer 481, gate electrodes 485 formed on a gate insulation film (not shown), and a drain electrode 486 connected to the opposite surface of n⁺ substrate 491.

If such an integrated circuit is prepared as shown in FIG. 16, the circuit cannot be operated due to the forward bias present at the p-n junction between epitaxial layer 490 and p-type source diffusion layer 462 of PMOS transistor 460. The forward bias results from the 0.1 volt on-state voltage of the vertical voltage control switch 490, which produces a potential of 0.1 V in n⁻ epitaxial layer 490. When this forward bias is present, comparator circuit 455 cannot supply a normal gate voltage to the gate of vertical voltage control switch 480.

Thus, to operate a comparator circuit of the type shown in FIG. 12 in the integrated circuit shown in FIG. 15, the integrated circuit must be designed to include isolation layers between the comparator circuit 455 and vertical voltage control switch 480. An example of such an integrated circuit is shown in FIG. 17 and is generally designated by reference numeral 550.

Integrated circuit 550 includes a comparator circuit 555 including both PMOS (560) and NMOS (570) transistors and a vertical voltage control switch element 580 all formed on a p-type substrate 590. PMOS transistor 560 includes p-type source and drain diffusion layers 562 formed in the surface of a first n-type epitaxial layer 591, and a gate electrode 565 formed on a gate insulation film 566 bridging source and drain diffusion layers 562. NMOS transistor 570 includes a p-type base layer 571 formed in the surface of first n-type epitaxial layer 591, n-type source and drain diffusion layers 572 formed in the surface of p-type base layer 571, and a gate electrode 575 formed on gate insulation film 566 bridging source and drain diffusion layers 572. Vertical voltage control switch element 580 includes a p-type base layers 581 formed in the surface of a second n-type epitaxial layer 592, n-type source diffusion layers 582 formed in the surface of one of the p-type base layers 581, gate electrodes 585 formed on gate insulation film 566 bridging p-type base layers 581, and an n-type drain diffusion layer 595. By providing two separate n-type epitaxial layers 591 and 592 isolated by a portion of p-type substrate 590 for comparator circuit 555 and vertical voltage control switch 580, the p-n junction between first n-type epitaxial layer 591 and p-type source diffusion layer 562 of PMOS transistor 560 will remain inverse biased and comparator circuit 555 can supply a normal gate voltage to the gate of vertical voltage control switch 580.

However, the integrated circuit design shown in FIG. 17 is disadvantageous in that the isolating portions of the substrate make manufacturing and miniaturization difficult. Because the use of PMOS transistors in the comparator circuit necessitate the use of isolation layers, it is preferable to not use PMOS transistors in the comparator circuit to avoid such problems.

SUMMARY OF THE INVENTION

The present invention has been made in view of the above circumstances and has as an object to provide an integrated circuit including a comparator circuit and a vertical voltage control switch element formed on a single substrate that is compact and easy to manufacture.

Another object of the present invention is to provide a differential amplifier circuit and a comparator that can ensure high digitalization precision for the differential input voltage $V_{in}$ in the low level region. To ensure high digitalization precision, it is desirable to provide a comparator circuit in which an offset voltage, if present, does vary with respect to a reference voltage applied to the comparator.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the integrated circuit of this invention comprises a substrate, a comparator circuit, formed on the substrate, and a switch, formed on the substrate and connected to a load, for continuing or discontinuing the current supplied to the load in response to an output signal from the comparator circuit. The comparator circuit comprises a constant current source, input means for inputting a reference voltage signal and an input voltage signal, a differential amplifier including at least two parallel current paths each including a load element, and a MOS transistor having a gate connected to the input means to receive one of the input voltage signal and the reference voltage signal, a drain connected to said load element, and a source connected to the constant current source. The comparator circuit further comprises output means, connected to one of the current paths, for outputting the output signal, which is representative of the comparison of the input voltage signal and the reference voltage signal.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

A first embodiment of the invention is a differential amplifier having a constant current source and a differential amplifier circuit including at least two current paths arranged in parallel, each current path includes a load section and an amplifying element with a control input terminal, wherein D-type MOS transistors having no threshold voltage $V_{th}$, are used as the amplifying elements instead of E-type MOS transistors which have a threshold voltage $V_{th}$. A comparator for digitizing an input signal further includes switching means operable in response to the output signal of any one of the amplifying elements. The switching means may be an inverter circuit. The comparator is preferably constructed on a semiconductor integrated circuit.

In the differential amplifier circuit of the first embodiment, which uses D-type MOS transistors having no threshold voltage $V_{th}$, the MOS transistor is in an on state regardless of the voltage level applied to the control input terminal of the amplifying element. Accordingly, if an input voltage having a potential level within a subthreshold region, which ranges from the reference voltage for the E-type MOS transistor to the threshold voltage $V_{th}$, is applied to a pair of control input terminals of the differential amplifier circuit using D-type MOS transistors as the amplifying elements, the amplifying elements operate in the differential amplifying mode so that a balancing potential can always be obtained. Thus, a digital signal can be produced without using a level shift circuit, for example, even in a case where the reference voltage is set to be extremely biased towards the source potential.

Figure 1:
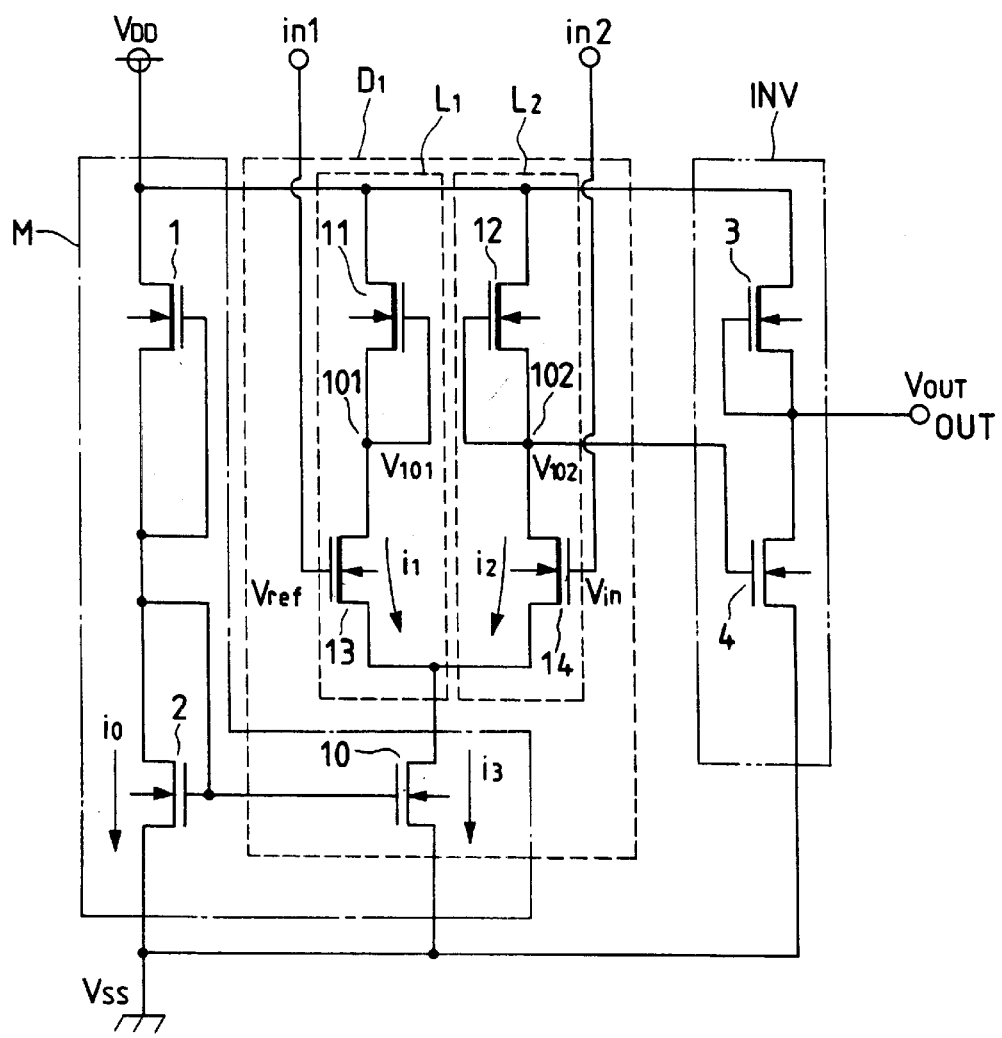
FIG. 1 is a circuit diagram showing a comparator using a differential amplifier circuit according to a first embodiment of the present invention.

FIG. 1 is a circuit diagram showing a comparator using a differential amplifier circuit according to the first embodiment of the present invention. As shown, the comparator is made up of a current mirror circuit M, a differential amplifier circuit $D_1$ with two current paths $L_1$ and $L_2$, and an inverter INV. The output section of the current mirror circuit M operates as a constant current source for the differential amplifier circuit $D_1$.

A drain current $i_0$ of an E-type MOS transistor 2 flows, as a reference current, from a voltage source $V_{DD}$ to the input section of the current mirror circuit M, through a load MOS transistor 1 of the D-type. A drain current $i_3$, which depends on the reference current $i_0$, flows through an E-type MOS transistor 10 in the output section.

Figure 12:
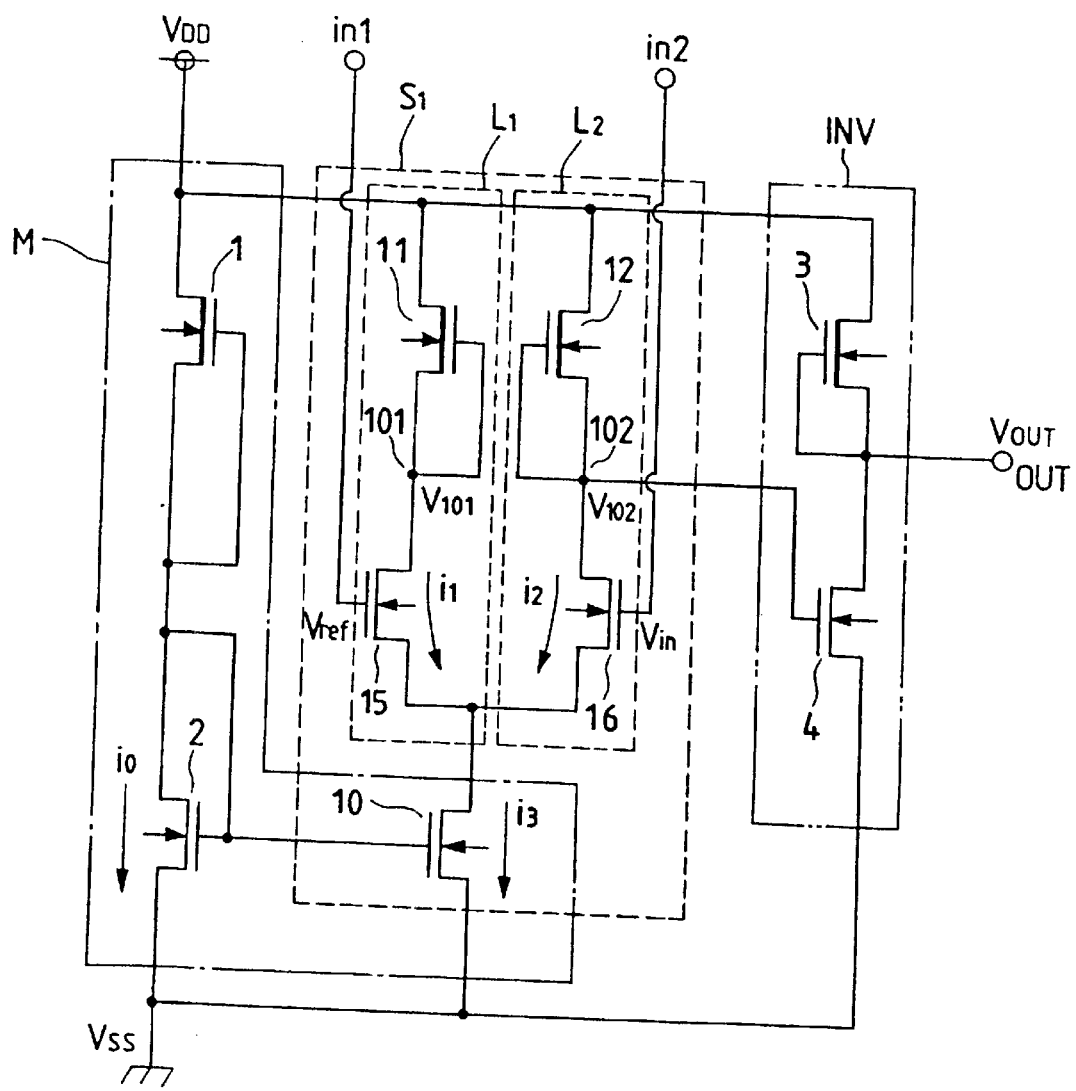
FIG. 12 is a circuit diagram of a comparator using a conventional differential amplifier circuit.
Figure 13A:
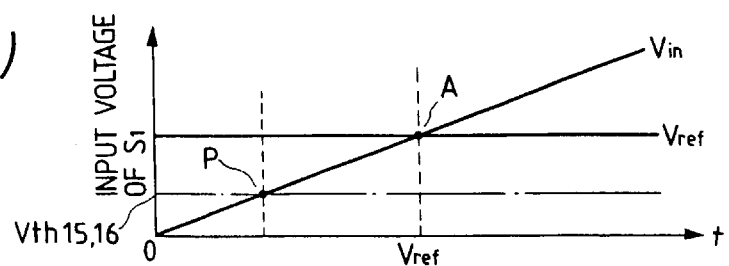
FIGS. 13(a)–13(c) are graphs showing signal waveforms at key points when the reference voltage is set to be higher than the threshold value of the amplifying element in the conventional comparator.
Figure 13B:
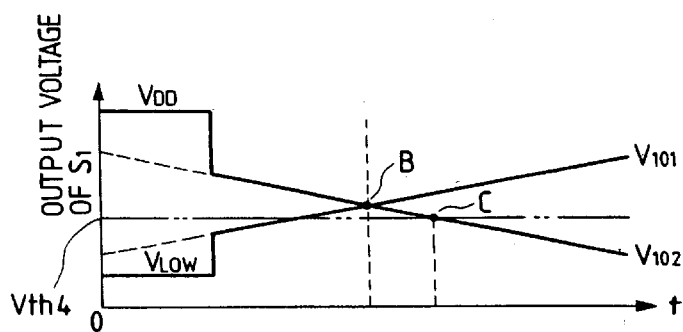
Figure 13C:
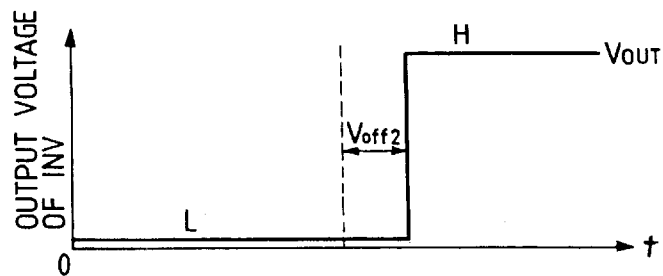

In the first current path $L_1$ of the differential amplifier circuit $D_1$, a drain current $i_1$ flows from the voltage source $V_{DD}$ and passes through a D-type MOS transistor 11, which serves as a load transistor, and an E-type MOS transistor 13, which serves as an amplifying transistor. In the second current path $L_2$, a drain current $i_2$ flows from the voltage source $V_{DD}$ and passes through a D-type MOS transistor 12, which serves as a load transistor, and an E-type MOS transistor 14, which serves as an amplifying transistor. The gates of the amplifying transistors 13 and 14 are respectively connected to input terminals in1 and in2 as the input terminals of the differential amplifier circuit $D_1$. The current paths $L_1$ and $L_2$ are connected to the output section (as a constant current source) of the current mirror circuit M. Accordingly, equation (1) discussed above holds true for the circuit of FIG. 1 as well as the circuit of FIG. 12. When the voltages applied to the input terminals in1 and in2 are equal to each other, equation (2) discussed above, also holds for this circuit.

The inverter INV is made up of a MOS transistor 4, which serves as a switching element, and a MOS transistor 3, which serves as a load transistor, wherein both the MOS transistor 3 and the MOS transistor 4 are connected in series. The gate of the MOS transistor 4 receives the output voltage (differential amplifier voltage) $V_{102}$ present at the node 102.

The inverter INV produces a digitized signal $V_{OUT}$ as a binary signal having a high or low logic level, which depends on the amplitude of the input voltage $V_{in}$ relative to that of the reference voltage $V_{ref}$. As recalled, the input voltage $V_{in}$ is applied to the input terminal in2 and the reference voltage $V_{ref}$ to the input terminal in1.

N-channel D-type MOS transistors 13 and 14 are used for the amplifying elements of the differential amplifier circuit $D_1$. Even in the subthreshold region ranging from the ground potential $V_{SS}$ to the threshold voltage $V_{th}$ (normally 0 to about +1.5 V), the D-type MOS transistors 13 and 14 are in an on state. Accordingly, the differential amplifier circuit $D_1$ can produce a differential amplifier output signal, which is based on the linear characteristics of the differential amplifier circuit even in the low level region, as will be described below.

Figure 2A:
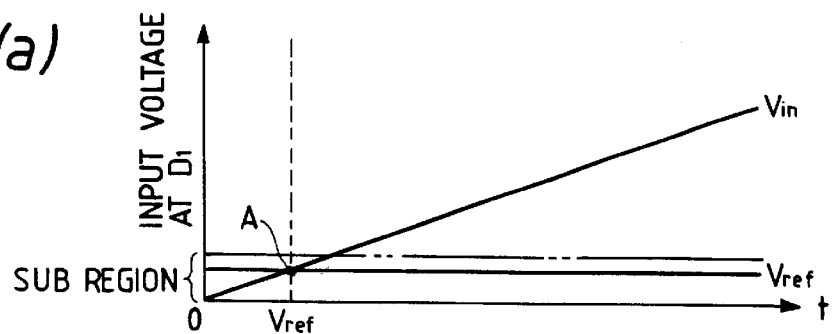
FIGS. 2(a)–2(c) are graphs showing signal waveforms at key points in the first embodiment.
Figure 2B:
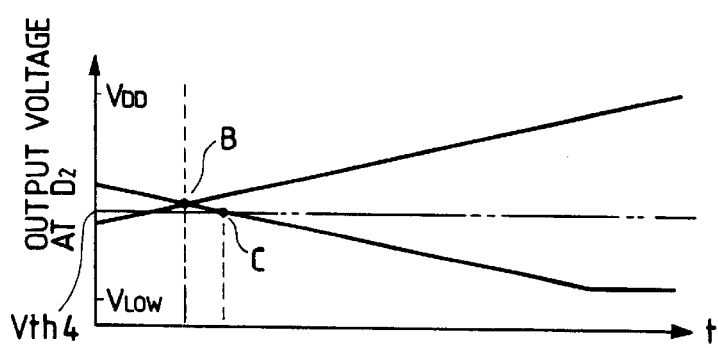
Figure 2C:
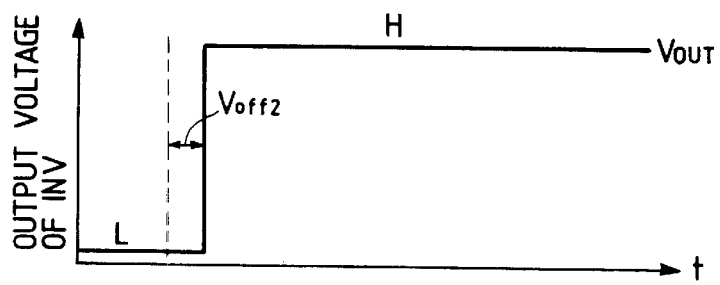

FIG. 2(a) is a graph showing variations of the input potentials ($V_{in}$ and the reference voltage $V_{ref}$) of the differential amplifier circuit $D_1$ with respect to time t wherein the reference voltage $V_{ref}$ at the input terminal in1 is lower than a subthreshold region (referred to as a SUB region). At point A, the reference voltage $V_{ref}$ is equal to the input voltage $V_{in}$ ($V_{ref}=V_{in}$). FIG. 2(b) is a graph showing variations of the output voltages (voltage $V_{101}$ at node 101 and voltage $V_{102}$ at node 102) of the differential amplifier circuit $D_1$ with respect to units of time t corresponding to the units of time of FIG. 2(a) wherein the input voltages $V_{in}$ and $V_{ref}$ of differential amplifier circuit $D_1$ are those shown in FIG. 2(a). A line consisting of alternating long and two short dashes indicates the threshold voltage $V_{th4}$ of the MOS transistor 4. Point B indicates a voltage balanced state ($V_{101}=V_{102}$), which corresponds to the voltage balanced state at point A. At point C, the voltage $V_{102}$ at the node 102 is equal to the threshold voltage $V_{th4}$. FIG. 2(c) is a graph showing variations of the output voltage $V_{OUT}$ of the inverter INV with respect to the input potential $V_{in}$ at the input terminal in2.

Figure 14A:
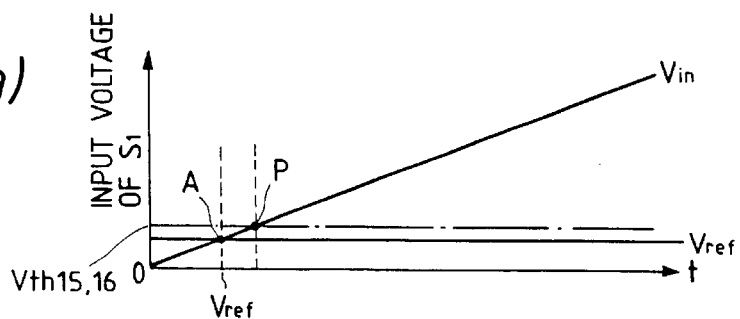
FIGS. 14(a)–14(c) are graphs showing signal waveforms at key points when the reference voltage is set to be lower than the threshold value of the amplifying element in the conventional comparator.
Figure 14B:
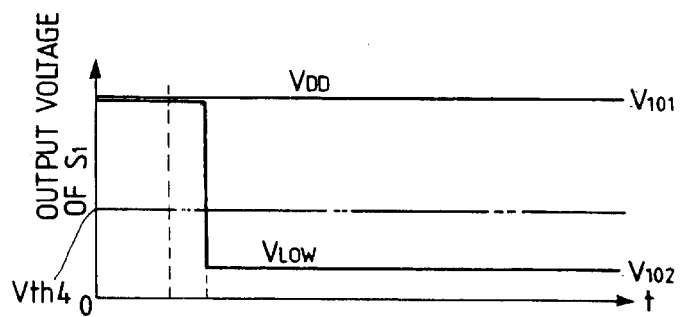
Figure 14C:
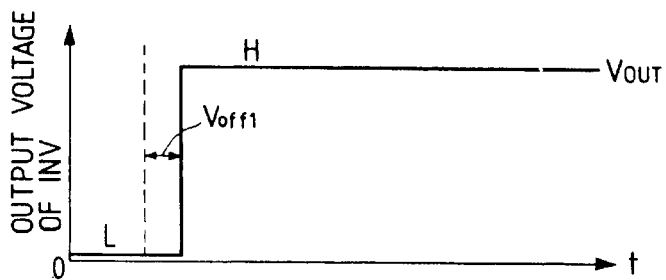

As shown in FIG. 2(a), also when the reference voltage $V_{ref}$ is set in the SUB region, the D-type MOS transistors 13 and 14 of the differential amplifier circuit $D_1$ are in an on state. Therefore, as shown in FIG. 2(b), the linear characteristic of the differential amplifier circuit $D_1$ is maintained also in this low level region. As will be described later, the fact that the linearity is ensured in the low level region indicates that the logic change point can be set at the balancing point in the cascade-connected differential amplifier circuits. As shown in FIG. 2(c), the offset voltage $V_{off2}$ caused by the threshold value of the inverter INV is present, but the offset voltage $V_{off1}$ shown in FIG. 14(c), which is caused by the threshold voltage of the differential amplifier circuit, is not present.

A second embodiment of the invention includes "n" stages of the differential amplifier circuits connected in cascade fashion and having the same construction as that of the differential amplifier circuit in the first embodiment. The amplifying elements in the first amplifier stage have a control input terminal. The output signal of the amplifying element in the i-th stage of said differential amplifier circuit is applied as a control signal to the amplifying element in the (i+1)th differential amplifier circuit. The amplifying elements of the first amplifier stage may be D-type MOS transistors. The amplified output signal of the n-th amplifier stage is a digital signal. To match the output signal with the logic level of a TTL family, switching means operable in response to the output signal of any one of the "n" amplifying elements may be provided. The switching means may be an inverter circuit. Such a comparator is preferably constructed on a semiconductor integrated circuit.

According to the arrangement of the second embodiment, if the difference between the voltages applied to the pair of control input terminals of the first stage of the cascade-connected differential amplifier circuits is small, the differential amplified output signal of the final amplifier stage is extremely large in amplitude and has a steep rise and fall waveform profile. In each amplifier stage, no current flows into the amplifying element of one of the paired current paths connected in parallel. Accordingly, no voltage drop takes place across the load, so that the output signal is equal to the source potential in level and provides the upper limit of the output characteristic. In such a case, a maximum current flows into the amplifying element in the other current path. The output signal reaches such a potential level as to cause a maximum voltage drop across the load, and provides the lower limit of the output characteristic. Thus, the amplified voltage signal output from the differential amplifier circuit is confined by the upper and the lower limits. Accordingly, the output voltage signal, which otherwise is an analog signal, can be treated as a digital signal.

In the conventional comparator, discussed above with reference to FIG. 12, a digital signal is obtained through a switching circuit from the amplified voltage signal output from a single differential amplifier circuit. Therefore, the conventional comparator further suffers from the following problems. Between the single differential amplifier circuit and the switching circuit, the balancing potential of the differential amplifier circuit is not coincident, with the threshold voltage characteristic of the switching element. When the reference voltage is varied, the balancing potential of the differential amplifier circuit also varies. In the present invention, because multiple stages of differential amplifier circuits are connected in cascade fashion, a digital signal can be realized without the need of a switching circuit. Therefore, the problems as stated above will not be created in the present invention. Further, in the present invention, the logic level changing point of the digital signal coincides with a comparison point where the input voltage $V_{in}$ is equal to the reference voltage $V_{ref}$ so that high precision digitalization is realized.

Figure 3:
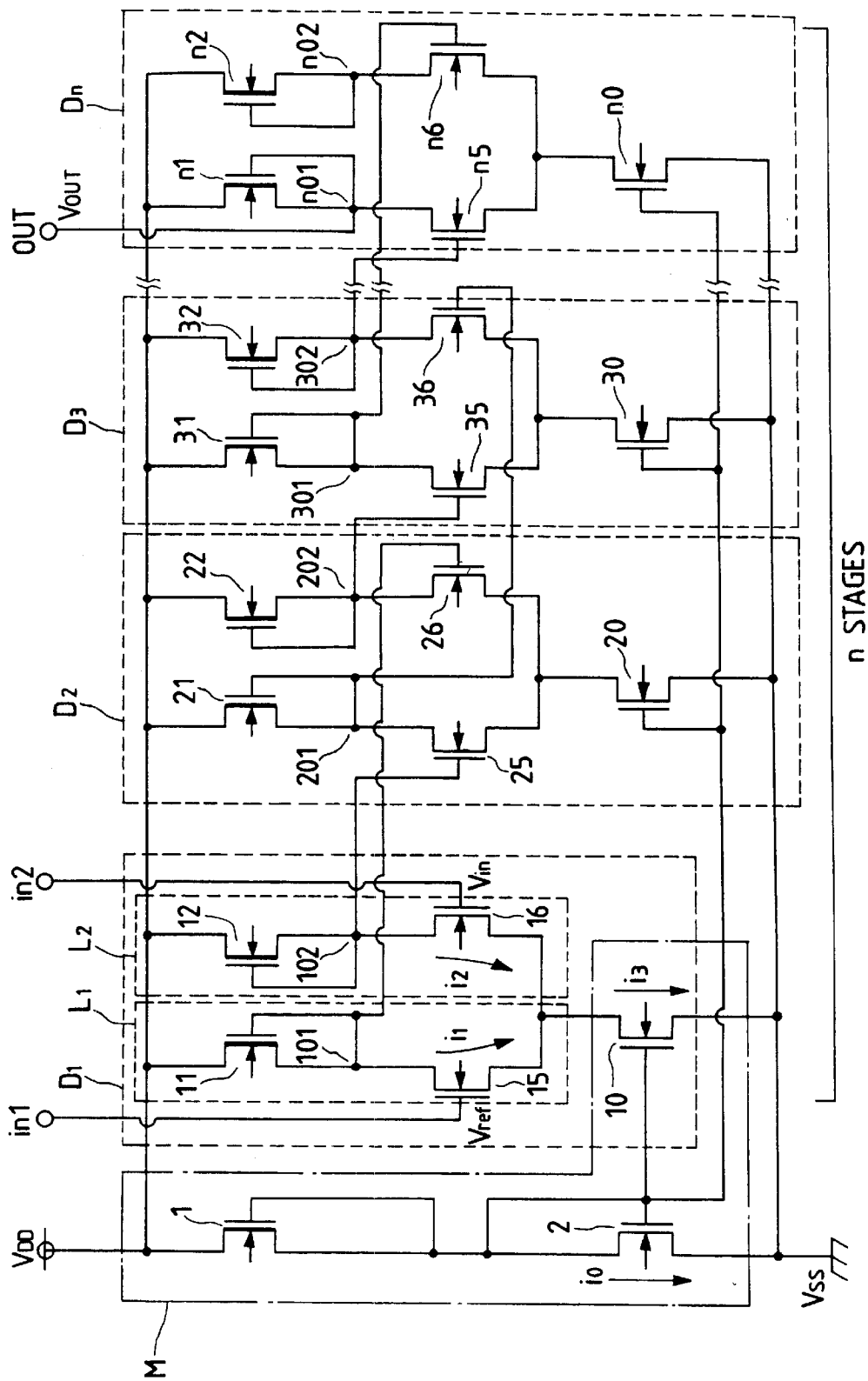
FIG. 3 is a circuit diagram showing a comparator using a differential amplifier circuit according to a second embodiment of the present invention.

FIG. 3 is a circuit diagram showing a comparator using differential amplifier circuits according to the second embodiment of the present invention. As shown, the comparator includes a multiple of stages of differential amplifier circuits $D_1$ to $D_n$ connected in cascade. The comparator, includes a current mirror circuit M, and at least one differential amplifier circuit $D_1$ with two current paths $L_1$ and $L_2$, which respectively have input terminals in1 and in2. The output section of the current mirror circuit operates as a constant current source for the differential amplifier circuit $D_1$. The MOS transistors 15 and 16, which serve as the amplifying elements of the differential amplifier circuit $D_1$, are of the E-type. Nodes 101 and 102, which represent the amplified output voltages of the differential amplifier circuit $D_1$ of a first stage in the cascade arrangement, are respectively connected to the gates of the amplifying MOS transistors 26 and 25 of the differential amplifier circuit $D_2$ of a second stage. Nodes 201 and 202 of the differential amplifier $D_2$ are respectively connected to the gates of the amplifying MOS transistors 36 and 35 of the differential amplifier circuit $D_3$ of a third stage. The node-to-gate connection is continued when the n-th amplifier stage is reached. In this way, a differential amplifier arrangement consisting of multiple stages is constructed. MOS transistors 20 to n0, which serve as the constant current sources of the differential amplifier circuits $D_2$ an $D_n$, each make up a current mirror circuit in cooperation with the MOS transistor 2. In this embodiment, the constant current sources are arranged in parallel for the output section of the current mirror circuit M. Alternatively, the constant current source may be arranged in a hierarchical structure for the output section. The output signal OUT is derived from a node n01 of the final differential amplifier stage $D_n$.

In this embodiment, since the N channel E-type MOS transistors are used for the amplifying elements of the differential amplifier circuit, the amplified voltage loses its linearity in the subthreshold voltage region of the voltage applied to the input terminals in1 and in2, as in the conventional differential amplifier circuit. Therefore, the digital signal cannot be produced in the SUB region. However, when the reference voltage $V_{ref}$ is higher than the threshold voltages $V_{th15}$ and $V_{th16}$ of the amplifying MOS transistors 15 and 16, it can produce a high precision digital signal.

Figure 5A:
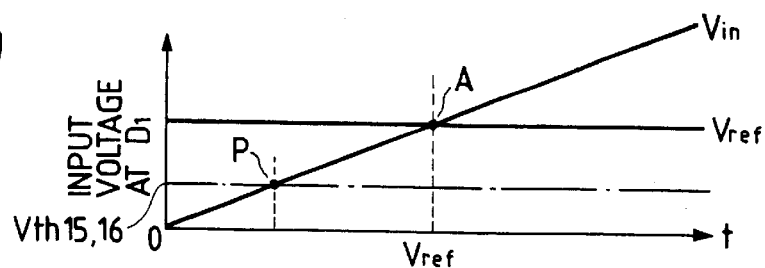
FIGS. 5(a)–5(f) are graphs showing signal waveforms at key points in the second embodiment.
Figure 5B:
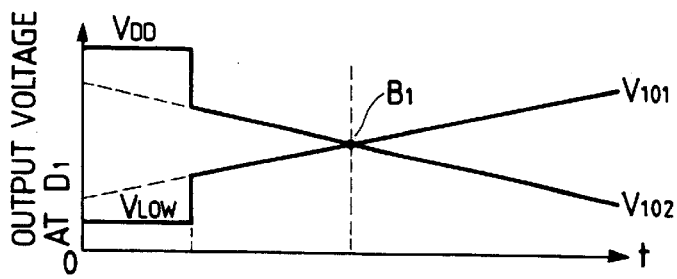
Figure 5C:
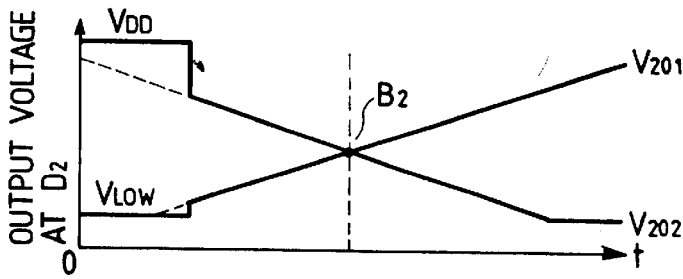
Figure 5D:
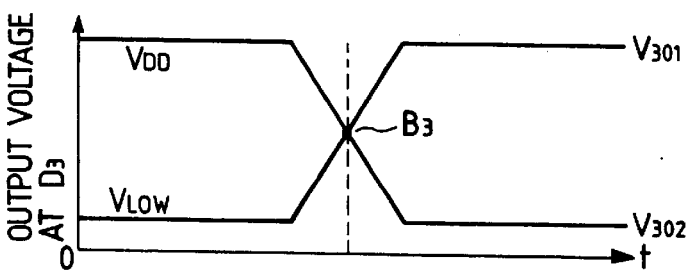
Figure 5E:
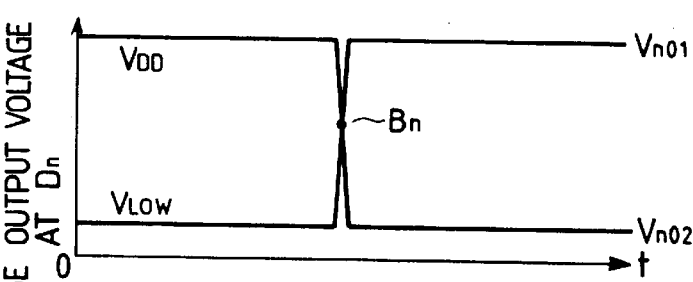

FIG. 5(a) is a graph showing variations of the input potentials ($V_{in}$ and the reference voltage $V_{ref}$) of the differential amplifier circuit $D_1$ with respect to time t wherein the reference voltage $V_{ref}$ at the input terminal in1 is higher than the threshold voltages $V_{th15}$ and $V_{th16}$ of the amplifying MOS transistors 15 and 16. At point A, the reference voltage $V_{ref}$ is equal to the input voltage $V_{in}$ ($V_{ref}=V_{in}$). FIG. 5(b) is a graph showing variations of the output voltages (voltage $V_{101}$ at node 101 and voltage $V_{102}$ at node 102) of the differential amplifier circuit $D_1$ with respect to units of time t corresponding to the units of time of FIG. 5(a) wherein the input voltages $V_{in}$ and $V_{ref}$ of differential amplifier circuit $D_1$ are those shown in FIG. 5(a). Point $B_1$ indicates a voltage balanced state ($V_{101}=V_{102}$), which corresponds to the voltage balanced state at point A. FIG. 5(c) is a graph showing variations of the output voltages (voltage $V_{201}$ at node 201 and voltage $V_{202}$ at node 202) of the differential amplifier circuit $D_2$ with respect to units of time t corresponding to the units of time of FIGS. 5(a) and 5(b) wherein the input voltages $V_{in}$ and $V_{ref}$ of differential amplifier circuit $D_1$ are those shown in FIG. 5(a). Point $B_2$ indicates a voltage balanced state ($V_{201}=V_{202}$), which corresponds to the voltage balanced state at point A. FIG. 5(d) is a graph showing variations of the output voltages (voltage $V_{301}$ at node 301 and voltage $V_{302}$ at node 302) of the differential amplifier circuit $D_3$ with respect to units of time t corresponding to the units of time of FIGS. 5(a)–5(c) wherein the input voltages $V_{in}$ and $V_{ref}$ of differential amplifier circuit $D_1$ are those shown in FIG. 5(a). Point $B_3$ indicates a voltage balanced state ($V_{301}=V_{302}$), which corresponds to the voltage balanced state at point A. FIG. 5(e) is a graph showing variations of the output voltages (voltage $V_{n^{01}}$ at node n01 and voltage $V_{n^{02}}$ at node n02) of the differential amplifier circuit $D_n$ with respect to units of time t corresponding to the units of time of FIGS. 5(a)–(d) wherein the input voltages $V_{in}$ and $V_{ref}$ of differential amplifier circuit $D_1$ are those shown in FIG. 5(a). Point $B_n$ indicates a voltage balanced state ($V_{n^{01}}=V_{n^{02}}$), which corresponds to the voltage balanced state at point A.

It is assumed that in FIG. 5(a), the difference of the voltages applied to the differential amplifier circuit $D_1$ is $|V_{ref}-V_{in}|$. When the reference voltage $V_{ref}$ is equal to the input voltage $V_{in}$, $|V_{ref}-V_{in}|$0. The amplified voltage differences are also zero in a balanced state at the respective amplifier stages. Accordingly, the balanced states at points A to $B_n$ take place at the same thing.

Assuming that the differential amplifier gain is G, the output voltage difference $|V_{101}-V_{102}|$ of the differential amplifier circuit $D_1$ is given by $$|V_{101}-V_{102}|=G\times|V_{ref}-V_{in}| \quad (4)$$

The output voltage difference $|V_{n^{01}}-V_{n^{02}}|$ of the n-the stage differential amplifier circuit $D_n$ is given by $$|V_{101}-V_{102}|G^n\times|V_{ref}-V_{in}| \quad (5)$$

Therefore, the output voltage characteristics of the differential amplifier circuits $D_1, D_2, D_3, \ldots, D_n$ are as shown in the figures. As the number of differential amplifier stages is increased, the output voltages more steeply change with increase of the amplified voltage, with respect to the balancing points $B_1, B_2, B_3, \ldots, B_n$. The upper limit of the output voltage of each differential amplifier circuit is at the source voltage $V_{DD}$, while the lower limit is at the voltage $V_{LOW}$, which is the lowest voltage relative to the ground potential. Consequently, the output characteristic profile of the final amplifier stage $D_n$ may be considered to be the profile of a digitized signal. The logic state of the digitized signal changes invariably at the balancing point $B_n$, so that the signal is not attended by the offset voltage $V_{off1}$, which depends on the threshold voltage of the subsequent inverter. In other words, since the digitized signal can be obtained without the switching circuit, for example, the inverter of the subsequent stage, it is not attended by the offset voltage $V_{off1}$ and hence high precision digitalization is realized. As in the conventional circuit, as the reference voltage $V_{ref}$ is set to be lower, the balancing potential rises to a certain degree. However, the digitalization precision is almost invariable against the variation of the reference voltage $V_{ref}$ since the changes in logic level take place at the timing of the balancing point. Therefore, in this embodiment, there is eliminated the dependency of the digitalization precision on the reference voltage $V_{ref}$. When the input voltage $V_{in}$ is lower than the threshold voltage $V_{th15}$ and $V_{th16}$ the MOS transistor 16 is in an off state, while the MOS transistor 15 is in an on state. Accordingly, the node 102 is pulled up to the source voltage $V_{DD}$ and the voltage $V_{102}$ at the node 101 is at the lowest level $V_{LOW}$. The differential characteristic is not linear as shown in FIGS. 5(b) and 5(c). However, this is not problematic in the digitizing operation since the output characteristic depends on the polarity of the input voltage difference.

Figure 4:
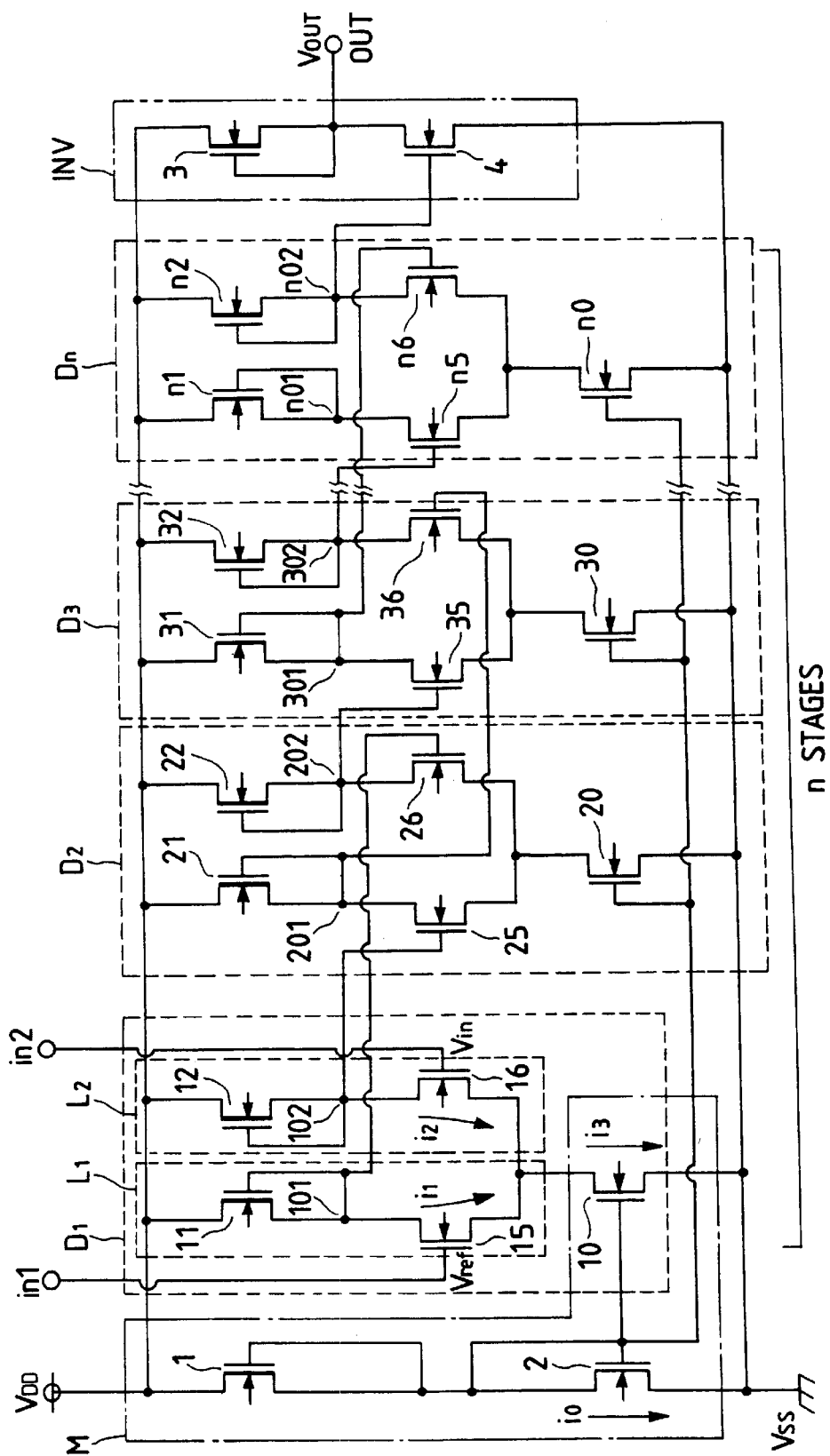
FIG. 4 is a circuit diagram showing a comparator using a differential amplifier circuit according to a third embodiment of the present invention.
Figure 5F:
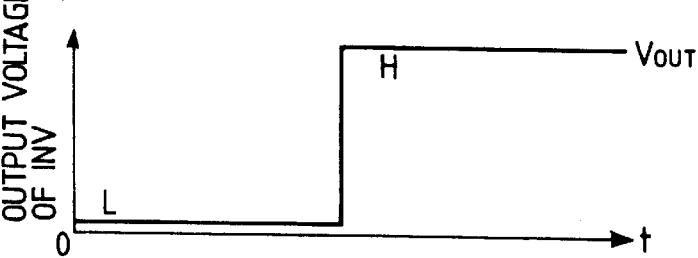

FIG. 4 is a circuit diagram showing a comparator using the differential amplifier circuit according to the third embodiment of the invention. The comparator, which is based on the cascade-connected arrangement of the differential amplifier circuits shown in FIG. 3, further includes an inverter INV. FIG. 5(f) is a graph showing variations of the output voltage $V_{OUT}$ of the inverter INV with respect to units of time t corresponding to the units of time of FIGS. 5(a)–(e) wherein the input voltages $V_{in}$ and $V_{ref}$ of differential amplifier circuit $D_1$ are those shown in FIG. 5(a) and wherein the reference voltage $V_{ref}$ at the input terminal in1 is higher than the threshold voltages $V_{th15}$ and $vth_{16}$ of the amplifying MOS transistors 15 and 16. The logic levels of the output voltage signal of the final amplifier stage are such that a high logic level is at the source potential $V_{DD}$ and a low logic level is at the lowest level $V_{LOW}$ of the amplifier output signal. To match it with the logic levels of the TTL logic family, for example, the inverter INV is provided so as to set the low logic level closer to the ground level $V_{SS}$.

Figure 6:
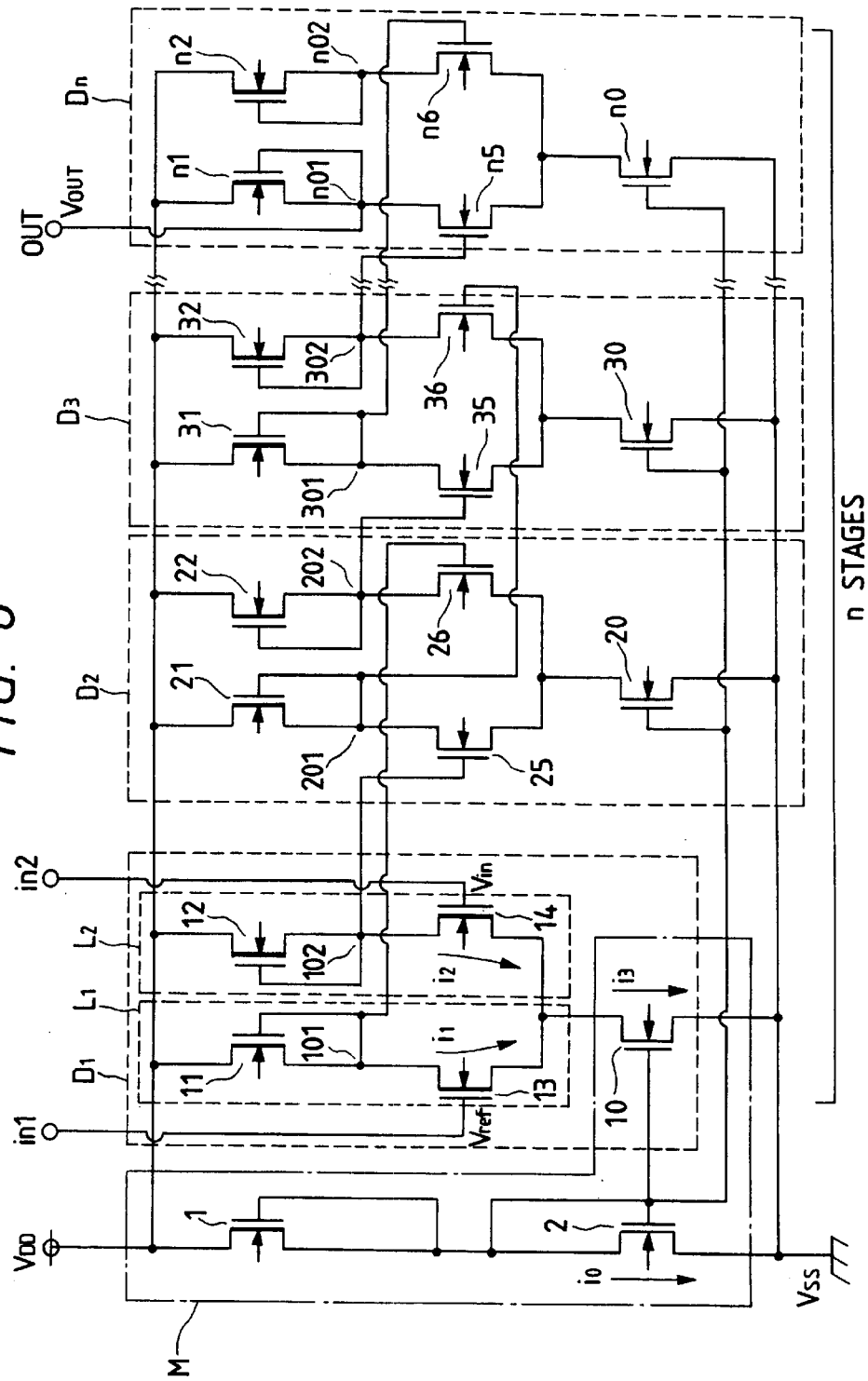
FIG. 6 is a circuit diagram showing a comparator using a differential amplifier circuit according to a fourth embodiment of the present invention.

FIG. 6 is a circuit diagram showing a comparator using the differential amplifier circuit according to the fourth embodiment of the invention.

Figure 8A:
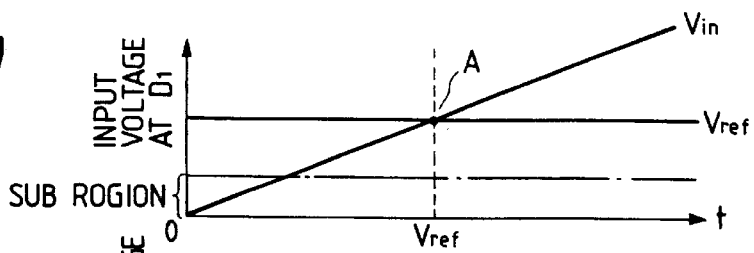
FIGS. 8(a)–8(f) are graphs showing signal waveforms at key points in the fourth embodiment.
Figure 8B:
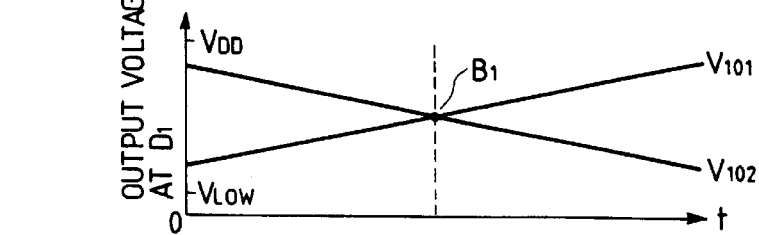
Figure 8C:
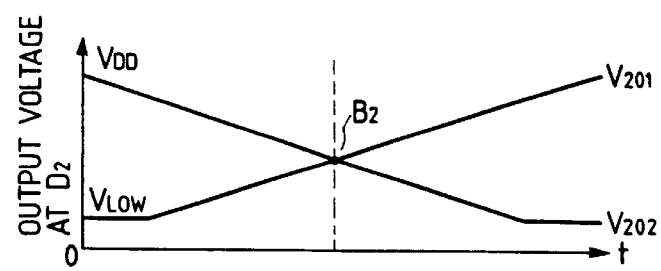
Figure 8D:
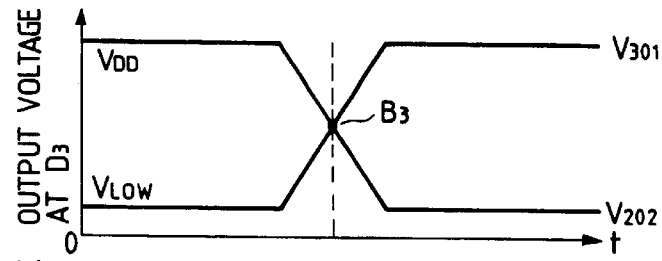
Figure 8E:
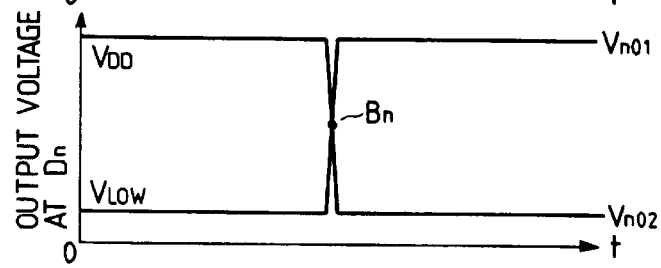
Figure 8F:
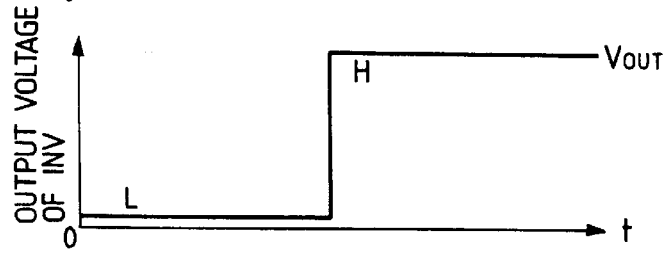

This embodiment is constructed by using D-type MOS transistors 13 and 14 for the amplifying elements 15 and 16 in the first amplifier stage $D_1$ in the comparator shown in FIG. 3. FIG. 8 shows graphs of signal waveforms at the key points of the comparator. As shown in FIG. 8(b), also in this embodiment, the differential amplifying function operates in the SUB region closer to the ground potential $V_{SS}$, as in the first embodiment. Accordingly, the digitalization is possible even in the low level region. Further, because of the cascade connection of the differential amplifier circuits, the offset voltage is not caused and the logic level changing point resides at the balancing point of the differential amplifier circuit. Accordingly, this embodiment has the advantageous features of both the first and second embodiments.

Figure 7:
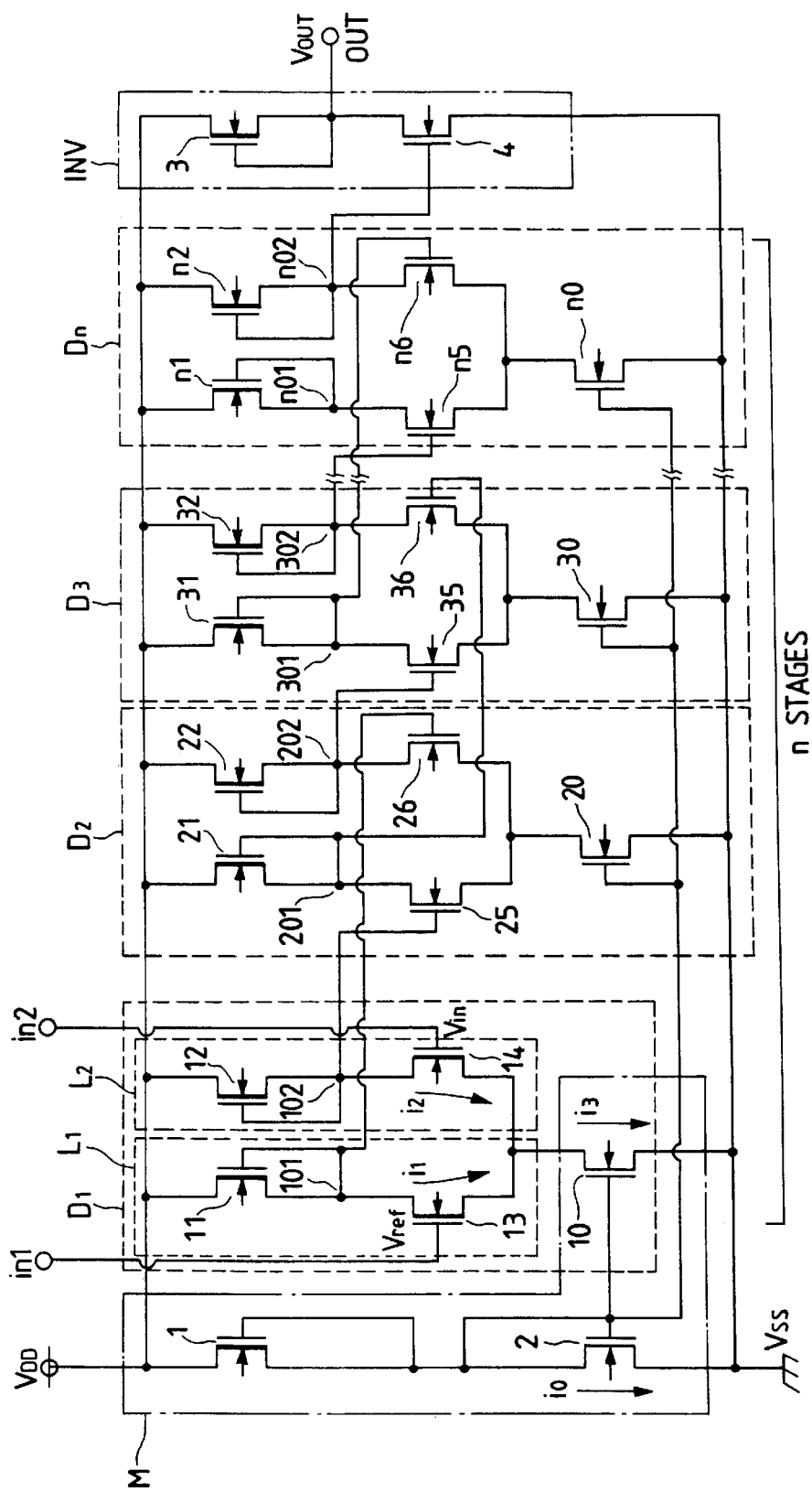
FIG. 7 is a circuit diagram showing a comparator using a differential amplifier circuit according to a fifth embodiment of the present invention.

FIG. 7 is a circuit diagram showing a comparator using the differential amplifier circuit according to the fifth embodiment of the invention.

In this embodiment, an inverter INV is used in addition to the comparator based on the cascade connection of differential amplifier circuits shown in FIG. 6. The reason why the inverter INV is additionally used is to match it with the logic level of the TTL family, for example, the low logic level is made to more approach to the ground potential $V_{SS}$.

In the respective embodiments as mentioned above, the D-type MOS transistor is used for the load element. When the differential amplifiers and the comparators of the invention are fabricated into an integrated circuit, an E-type MOS transistor or a diffusion resistor, in place of the D-type MOS transistor, may be used for the load element.

Figure 9:
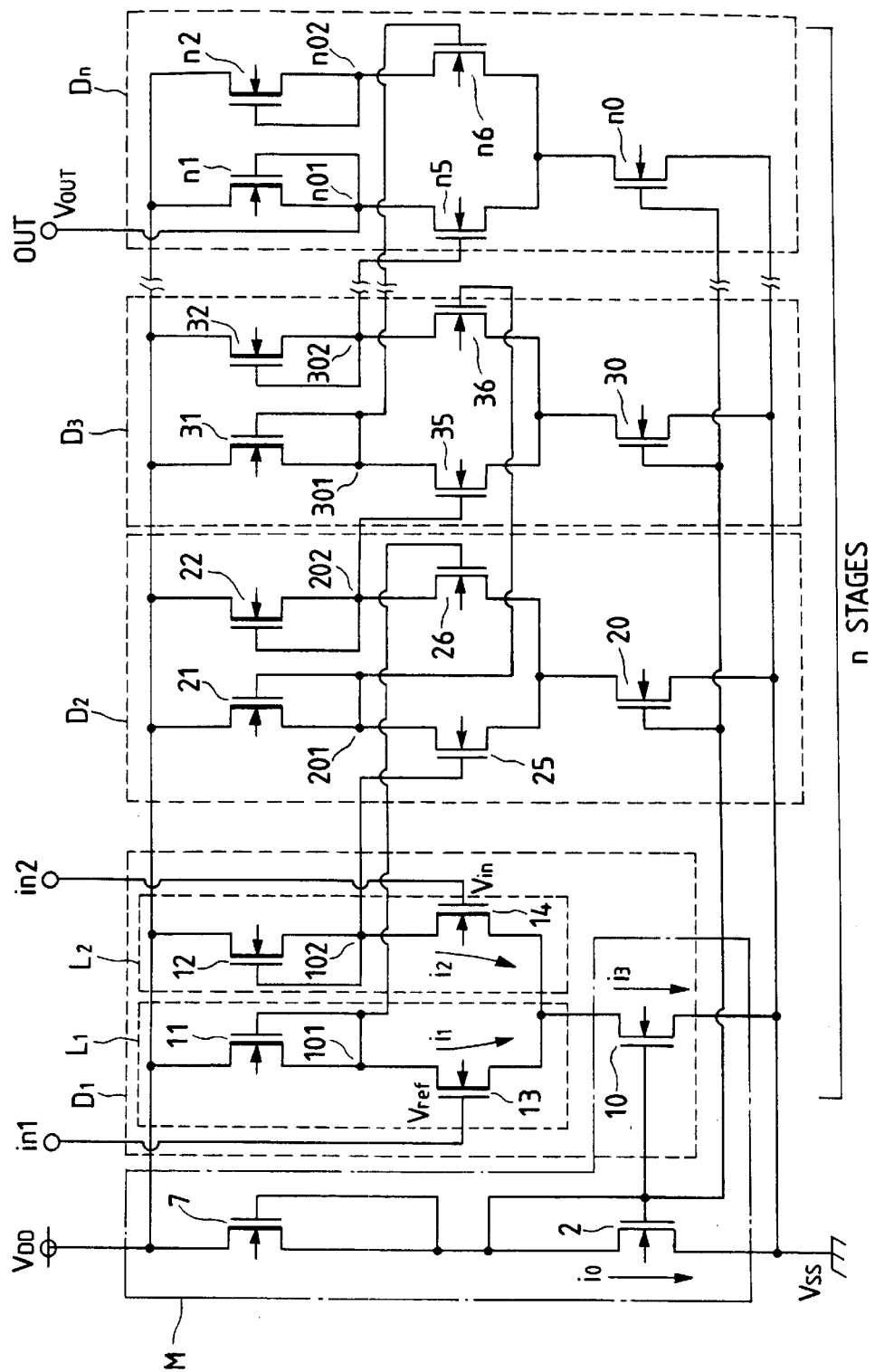
FIG. 9 is a circuit diagram showing a comparator using a differential amplifier circuit according to a sixth embodiment of the present invention.

FIG. 9 is a circuit diagram showing a comparator using the differential amplifier circuit according to the sixth embodiment of the invention. In this embodiment, an E-type MOS transistor 7 is used for the load element in the current mirror circuit M.

Figure 10:
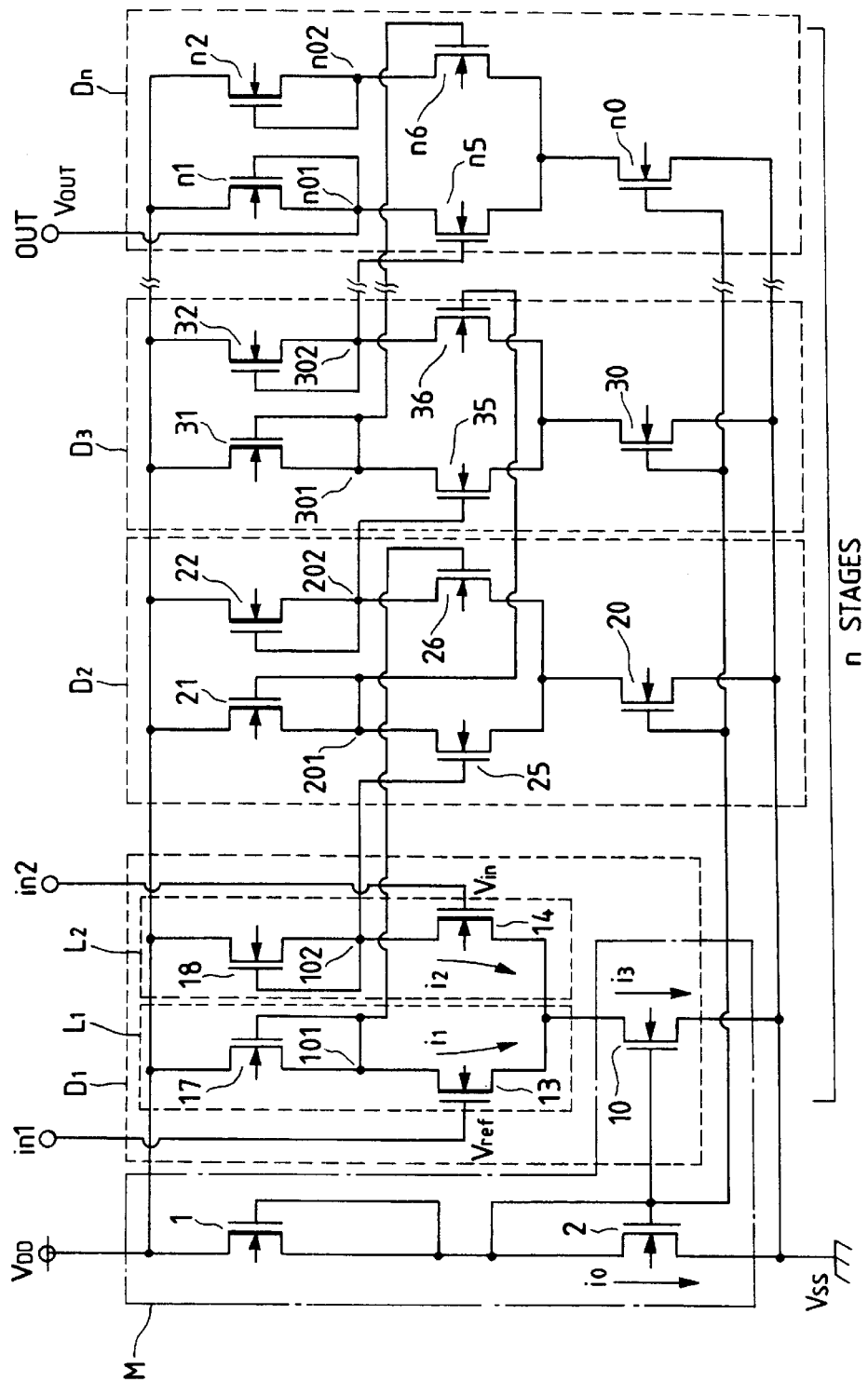
FIG. 10 is a circuit diagram showing a comparator using a differential amplifier circuit according to a seventh embodiment of the present invention.

FIG. 10 is a circuit diagram showing a comparator using the differential amplifier circuit according to the seventh embodiment of the invention. In this embodiment, E-type MOS transistors 17 and 18 are used for the load elements in the differential amplifier circuit $D_1$.

Figure 11:
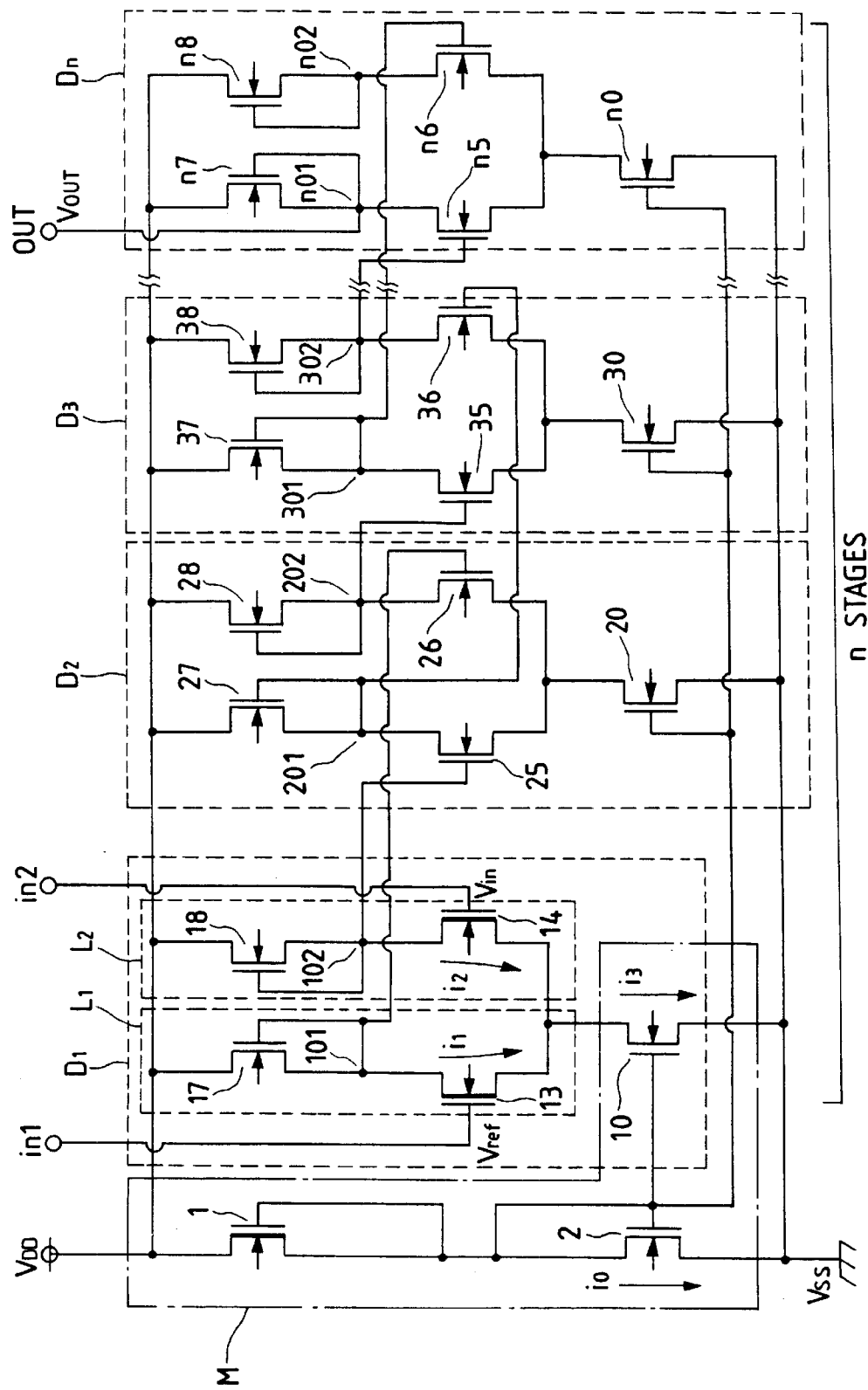
FIG. 11 is a circuit diagram showing a comparator using a differential amplifier circuit according to an eighth embodiment of the present invention.

FIG. 11 is a circuit diagram showing a comparator using the differential amplifier circuit according to the eight embodiment of the invention. In this embodiment, E-type MOS transistors 17, 18, 27, 28, 37, 38, n7, and n8 are used for the load elements in the differential amplifier circuit $D_1$ to $D_n$.

It will be evident to those skilled in the art that the N channel MOS transistors in the embodiments as mentioned above may be replaced by P channel MOS transistors. In this case, the source voltage $V_{DD}$ is a negative voltage relative to the ground potential $V_{SS}$, normally 0 V. Accordingly, the potential in the SUB region is a negative potential relative to the ground potential $V_{SS}$. It will be understood that based upon symmetric properties, if the reference voltage is set to be closer to the high potential side, the digital signal can be realized with high precision.

As seen from the foregoing description, in the present invention, the depletion type MOS transistors are used for the amplifying elements in the differential amplifier circuit. Accordingly, the following advantageous effects can be achieved.

Since the amplifying element has no threshold value, even if the reference voltage is extremely biased toward the source potential, the differential amplifying characteristics can be realized. Accordingly, the digitized signal in the low level region, which cannot be obtained by the conventional technique, can be obtained without using a level shift circuit, for example, so that the analog signal can be digitized with high precision, with removal of the offset voltage.

The multistage arrangement of the differential amplifier circuits connected in cascade allows the analog signal to be digitized without the switching means provided at the subsequent stage. Accordingly, the circuit is not attended by the offset voltage owing to the threshold value of the switching means, so that the high precision digitalization is realized free from the phase distortion. If the balancing points of the differential amplifier circuits are dislocated in accordance with the value of the reference voltage, the timings of the balancing points are invariable. The dislocation of the balancing points will not influence the digitalization precision.

Use of the different embodiments described above expands the range of the input voltages to be digitized and realizes high precision digitalization.

Figure 15:
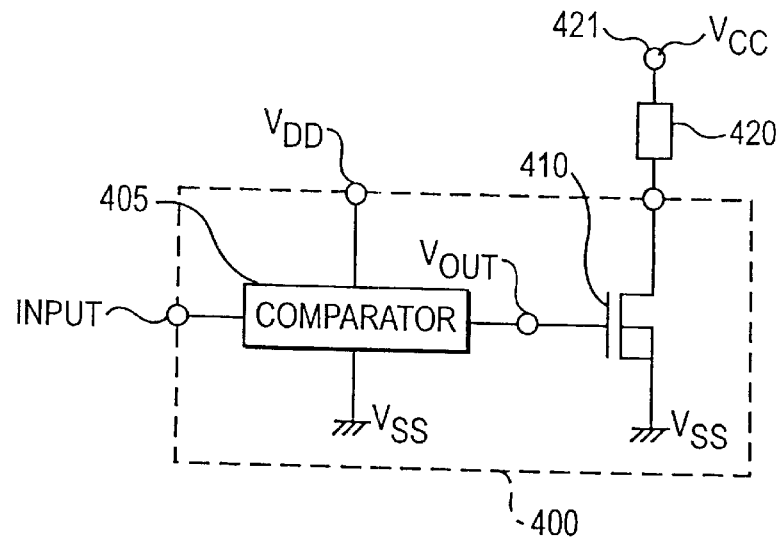
FIG. 15 is a circuit diagram of an integrated circuit including a comparator circuit and a switch element connected to a load.
Figure 17:
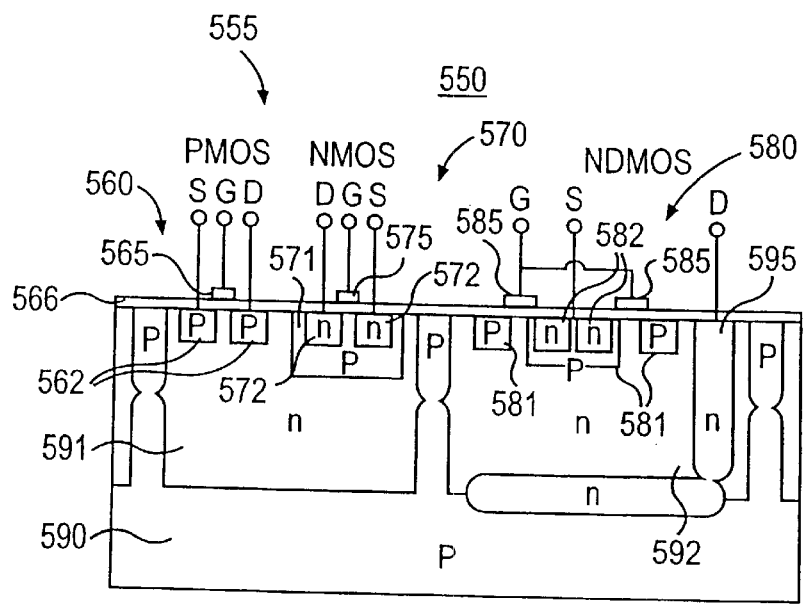
FIG. 17 is a partial cross sectional view of an integrated circuit including a comparator circuit and a switch element connected to a load where the comparator circuit and a switch element are isolated from one another.
Figure 16:
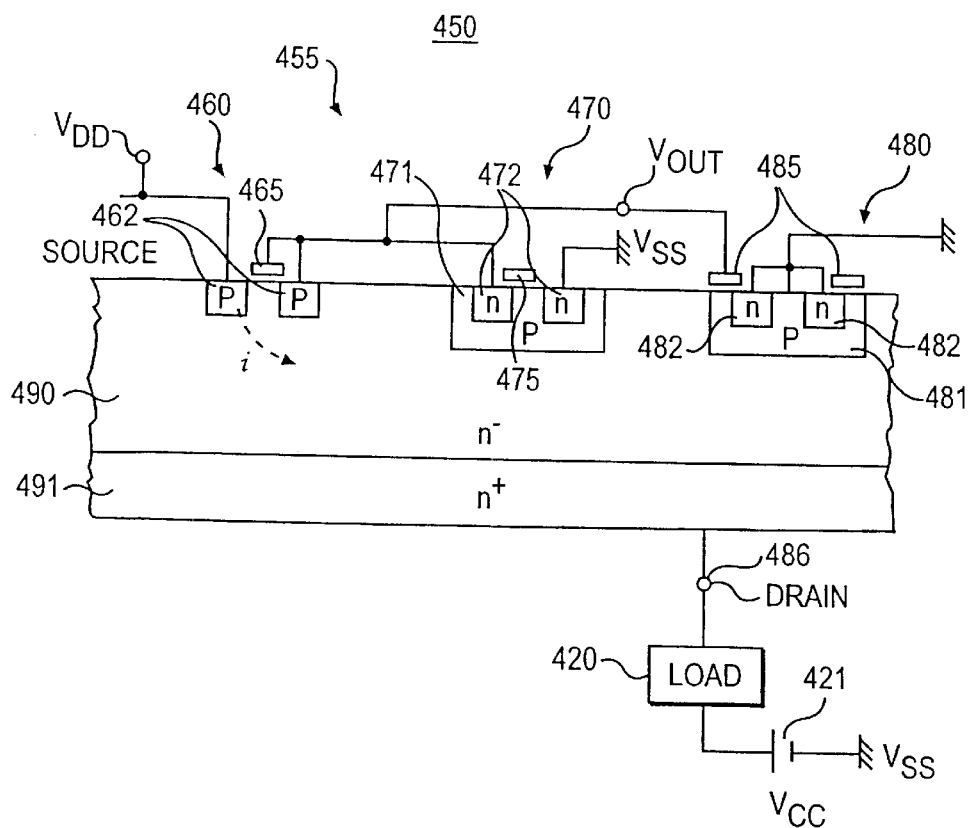
FIG. 16 is a partial cross sectional view of an integrated circuit including a comparator circuit having a PMOS transistor and a switch element connected to a load.
Figure 18:
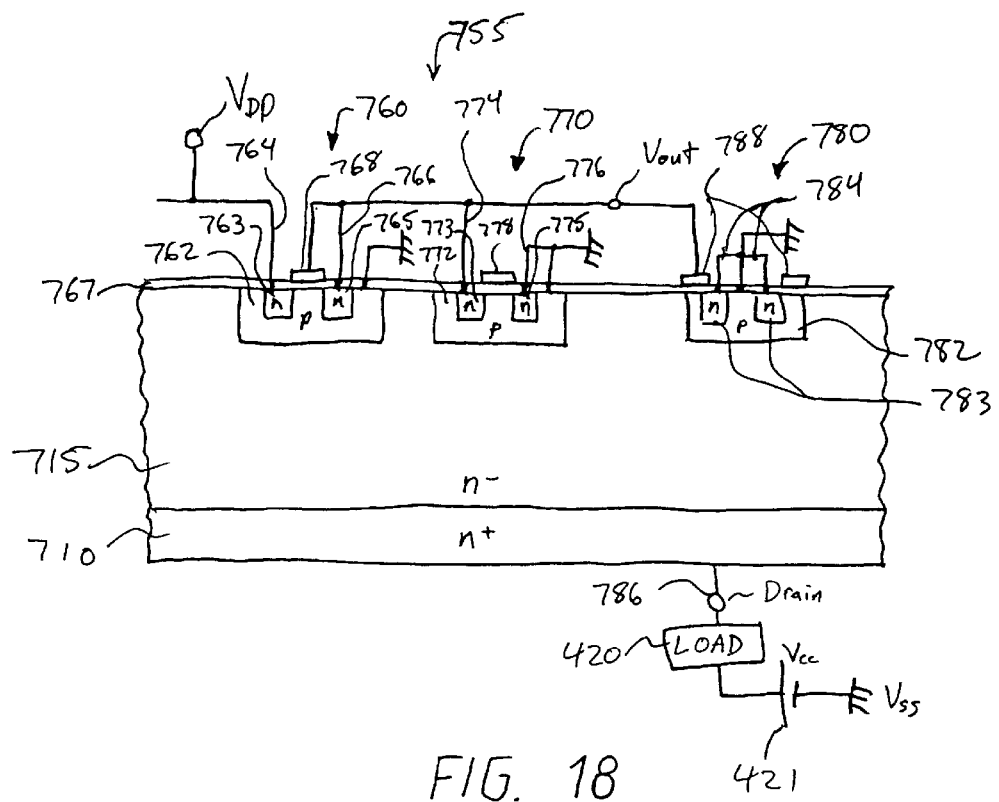
FIG. 18 is a partial cross sectional view of an integrated circuit according to a ninth embodiment of the present invention.

FIG. 18 shows the cross-section of an integrated circuit constructed according to a ninth embodiment of the present invention, which may employ the various embodiments of the comparator circuit described above in the manner described above with respect to FIG. 15.

The integrated circuit shown in FIG. 18 includes an n+substrate 710, an n⁻ epitaxial layer 715, a comparator circuit 755 including NMOS transistors 760 and 770, and a switching transistor 780.

NMOS transistor 760 includes a p-type base layer 762 formed in epitaxial layer 715, an n-type source diffusion layer 763 formed in p-type base layer 762, a source electrode 764 connected to n-type source diffusion layer 763, an n-type drain diffusion layer 765 formed in p-type base layer 762, a drain electrode 766 connected to n-type drain diffusion layer 765, a gate insulation film 767 covering portions of p-type base layer 762,-n-type source diffusion layer 763, and n-type drain diffusion layer 765, and a gate electrode 768 formed on a region of gate insulation film 767 bridging p-type base layer 762, n-type source diffusion layer 763, and n-type drain diffusion layer 765.

NMOS transistor 770 includes a p-type base layer 772 formed in epitaxial layer 715, an n-type source diffusion layer 773 formed in p-type base layer 772, a source electrode 774 connected to n-type source diffusion layer 773, an n-type drain diffusion layer 775 formed in p-type base layer 772, a drain electrode 776 connected to n-type drain diffusion layer 775, gate insulation film 767, which covers portions of p-type base layer 772, n-type source diffusion layer 773, and n-type drain diffusion layer 775, and a gate electrode 778 formed on a region of gate insulation film 767 bridging p-type base layer 772, n-type source diffusion layer 773, and n-type drain diffusion layer 775.

Switching transistor 780 is preferably a power MOSFET formed as an n channel DMOS (NDMOS) including a p-type base layer 782 formed in epitaxial layer 715, n-type source diffusion layers 783 formed in p-type base layer 782, source electrodes 784 connected to n-type source diffusion layers 783, a drain electrode 786 connected to the opposite surface of n⁺ substrate 710, gate insulation film 767, which covers portions of p-type base layer 782 and n-type source diffusion layers 783, and gate electrodes 788 formed on a region of gate insulation film 767 bridging p-type base layer 782 and n-type source diffusion layers 783.

Figure 19:
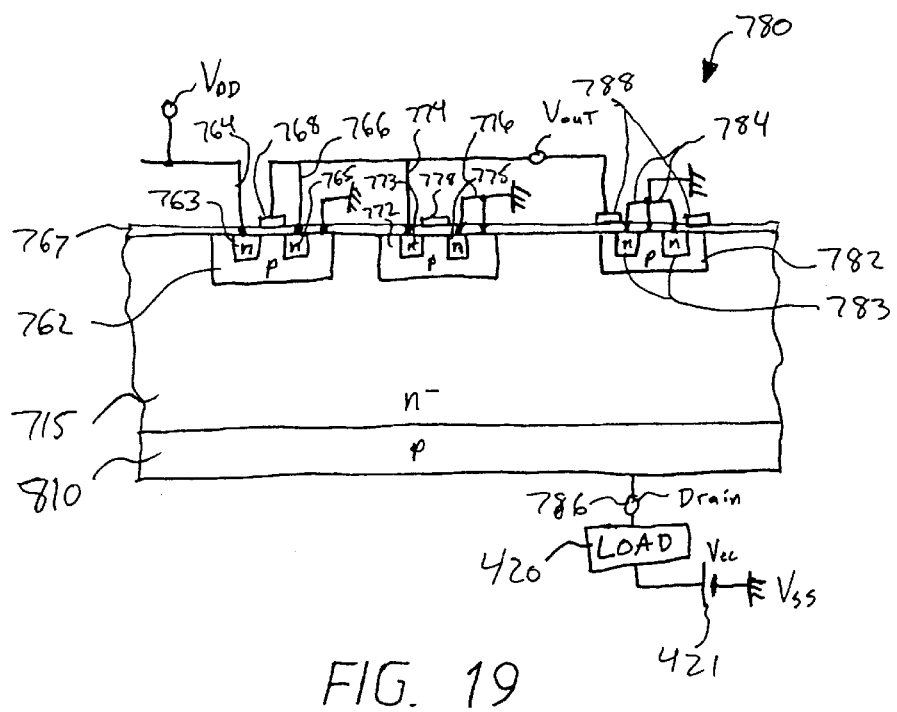
FIG. 19 is a partial cross sectional view of an integrated circuit according to a tenth embodiment of the present invention.

FIG. 19 illustrates an integrated circuit constructed according to a tenth embodiment of the present invention, which may employ the various embodiments of the comparator circuit described above.

The tenth embodiment of the integrated circuit shown in FIG. 19 is similar to the ninth embodiment shown in FIG. 18 except that n⁺ substrate 710 is replaced with a p-type substrate 810. By using p-type substrate 810, switching transistor 780, functions as an n channel insulated gate bipolar transistor (IGBT).

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An integrated circuit for controlling the current supplied to a load, the integrated circuit comprising:
   a substrate;
   a comparator circuit, formed on said substrate, comprising:
      a constant current source;
      input means for inputting a reference voltage signal and an input voltage signal;
      a differential amplifier including at least two parallel current paths, each including
         a load element, and
         a depletion-type MOS having a gate connected to said input means to receive one of said input voltage signal and said reference voltage signal, a drain connected to said load element, and a source connected to said constant current source; and
      output means, connected to one of said current paths, for outputting an output signal representative of the comparison of said input voltage signal and said reference voltage signal; and
   an insulated gate vertical switching transistor, formed on said substrate and connected to the load, for continuing or discontinuing the current supplied to the load in response to said output signal.

2. The integrated circuit of claim 1, wherein said output means of said comparator circuit comprises switching means for providing an inverted digital signal as said output signal to said switching transistor indicative of whether the input voltage signal has a value that is less than or greater than that of the reference voltage signal.

3. The integrated circuit of claim 2, wherein said switching transistor has a drain, a source connected to a ground potential, and a gate connected to a node in one of the current paths between the load element and the depletion-type MOS, the depletion-type MOS having a gate connected to said input means to receive said input voltage signal.

4. The integrated circuit of claim 2, wherein said output means further comprises an output load MOS transistor having a source connected to said switching means, a gate connected to said source of said output load MOS transistor, and a drain connected to a voltage source.

5. The integrated circuit of claim 1, wherein the load element of said current paths each have a drain connected to a voltage source, and a source and a gate both connected to a drain of the depletion-type MOS of the same current path.

6. The integrated circuit of claim 1, wherein said constant current source of said comparator circuit comprises a current source transistor having a gate, a drain connected to respective sources of the depletion-type MOS of the current paths, and a source connected to a ground potential.

7. The integrated circuit of claim 6, wherein said current source transistor is an enhancement-type MOS transistor.

8. The integrated circuit of claim 6, wherein said constant current source further comprises a current mirror circuit for controlling said current source transistor, said current mirror circuit comprising:
   a load transistor having a source, a gate connected to said source of said load transistor, and a drain connected to a voltage source; and
   an amplifying transistor having a drain connected to the source of said load transistor, a source connected to a ground potential, and a gate connected to the gate of said current source transistor.

9. The integrated circuit of claim 8, wherein said load transistor is a depletion-type MOS transistor.

10. The integrated circuit of claim 8, wherein said amplifying transistor is an enhancement-type MOS transistor.

11. The integrated circuit of claim 1, wherein said switching transistor is a power MOSFET transistor.

12. The integrated circuit of claim 1, wherein said switching transistor is an insulated gate bipolar transistor.

13. The integrated circuit of claim 1, further comprising an epitaxial layer formed on said substrate, wherein said switching transistor includes:
   a base layer formed in said epitaxial layer and having a conductivity type different from that of said epitaxial layer;
   a source diffusion layer formed in said base layer and having a conductivity type different from that of said base layer;
   a source electrode connected to said source diffusion layer;
   a gate insulation film covering portions of said base layer, said source diffusion layer, and said epitaxial layer;
   a gate electrode formed on a region of said gate insulation film bridging said base layer, said source diffusion layer, and said epitaxial layer; and
   a drain electrode connected to said substrate.

14. The integrated circuit of claim 13, wherein said switching transistor is a power MOSFET transistor, said substrate is an $n^+$-type substrate, said epitaxial layer is an $n^+$-type epitaxial layer, said base layer is a p-type base layer, and said source diffusion layer is of the n-type.

15. The integrated circuit of claim 13, wherein said switching transistor is an n-channel insulated gate bipolar transistor, said substrate is a p-type substrate, said epitaxial layer is an $n^-$type epitaxial layer, said base layer is a p-type base layer, and said source diffusion layer is of the n-type.

16. The integrated circuit of claim 1, further comprising an epitaxial layer formed on said substrate, wherein said load element and said depletion-type MOS of said differential amplifier, include:
   a p-type base layer formed in said epitaxial layer;
   an n-type source diffusion layer formed in said p-type base layer;
   a source electrode connected to said n-type source diffusion layer;
   an n-type drain diffusion layer formed in said p-type base layer;
   a drain electrode connected to said n-type drain diffusion layer;
   a gate insulation film covering portions of said p-type base layer, said n-type source diffusion layer, and said n-type drain diffusion layer; and
   a gate electrode formed on a region of said gate insulation film bridging said p-type base layer, said n-type source diffusion layer, and said n-type drain diffusion layer.

17. The integrated circuit of claim 16, wherein said switching transistor is a power MOSFET transistor, said substrate is an $n^+$-type substrate, and said epitaxial layer is an $n^-$-type epitaxial layer.

18. The integrated circuit of claim 16, wherein said switching transistor is an n-channel insulated gate bipolar transistor, said substrate is a p-type substrate, and said epitaxial layer is an n⁻-type epitaxial layer.

19. An integrated circuit for controlling current supplied to a load, the integrated circuit comprising:
- a substrate;
- a comparator circuit, formed on said substrate, comprising:
  - a constant current source;
  - a plurality of differential amplifiers each including:
    - a first current path including:
      - a first load element, and
      - a first amplifying element, connected between said first load element and said constant current source, and further connected to receive an input control signal,
    - a second current path, connected in parallel to said first current path, including:
      - a second load element, and
      - a second amplifying element, connected between said second load element and said constant current source, and further connected to receive a reference control signal; and
    - wherein a depletion-type transistor is used as both the load element and the amplifying element in at least one of the first current path and the second current path in no more than one of the plurality of differential amplifiers;
  - input means for inputting an input voltage signal as the input control signal to the first amplifying element of one of said plurality of differential amplifiers, and for inputting a reference voltage signal as the reference control signal to the second amplifying element of said one of said plurality of differential amplifiers; and
  - plural output means, respectively connected to said plurality of differential amplifiers, for outputting successive output signals representative of the comparison of said input voltage signal and said reference voltage signal by said one of said plurality of differential amplifiers; and
- a switch, including an insulated gate vertical switching transistor, formed on said substrate and connected to the load, for continuing or discontinuing the current supplied to the load in response to a last of said successive of output signals.

20. The integrated circuit of claim 19, wherein said first amplifying element of said one of said plurality of differential amplifiers includes a gate connected to receive the input voltage signal from said input means, a drain connected to said first load element, and a source connected to said constant current source.

21. The integrated circuit of claim 19, wherein said first amplifying element of said one of said plurality of differential amplifiers includes a gate connected to receive the reference voltage signal from said input means, a drain connected to said load element, and a source connected to said constant current source.

22. The integrated circuit of claim 19, wherein the depletion-type MOS transistors of the first and second load elements have drains connected to voltage sources, and respective sources and gates connected to the first and second amplifying elements, respectively.

23. The integrated circuit of claim 19, wherein said plural output means each comprises switching means for providing an inverted digital signal as one of the successive output signals indicative of whether the input voltage signal has a value that is less than or greater than that of the reference voltage signal.

24. The integrated circuit of claim 23, wherein said vertical switching transistor is a MOS transistor having a drain, a source connected to a ground potential, and a gate connected to a node between the second load element and the second amplifying element in the second current path of a last one of said successive other ones of said plurality of differential amplifiers.

25. The integrated circuit of claim 23, wherein each of said output means comprises an output load MOS transistor having a source connected to said switching means, a gate connected to said source of said output load MOS transistor, and a drain connected to a voltage source.

26. The integrated circuit of claim 19, wherein the MOS transistor of the first amplifying element of each of said plurality of differential amplifiers has a gate connected to a node between the second amplifying element and the second load element of a preceding differential amplifier, a drain connected to the first load element of the same differential amplifier, and a source connected to said constant current source, and wherein said MOS transistor of the second amplifying element of each of said plurality of differential amplifiers has a gate connected to a node between the first amplifying element and the first load element of a preceding differential amplifier, a drain connected to said second load element of the same differential amplifier, and a source connected to said constant current source.

27. The integrated circuit of claim 26, wherein said constant current source of said plurality of differential amplifiers respectively comprise a current source transistor having a gate, a drain connected to respective sources of the first and second MOS transistors of a corresponding differential amplifier, and a source connected to a ground potential.

28. The integrated circuit of claim 27, wherein the current source transistors are enhancement-type MOS transistors.

29. The integrated circuit of claim 27, wherein said constant current source further comprises a current mirror circuit for controlling said current source transistors, said current mirror circuit comprising:
- a load transistor having a source, a gate connected to said source of said load transistor, and a drain connected to a voltage source; and
- an amplifying transistor having a drain connected to the source of said load transistor, a source connected to a ground potential, and a gate connected to the gate of each of the current source transistors.

30. The integrated circuit of claim 29, wherein said load transistor is a depletion-type MOS transistor.

31. The integrated circuit of claim 29, wherein said amplifying transistor is an enhancement-type MOS transistor.

32. The integrated circuit of claim 29, wherein said vertical switching transistor is a power MOSFET transistor.

33. The integrated circuit of claim 29, wherein said vertical switching transistor is an insulated gate bipolar transistor.

* * * * *

UNITED STATES PATENT AND TRADEMARK OFFICE
CERTIFICATE OF CORRECTION

PATENT NO. : 6,462,587 B2
DATED : October 8, 2002
INVENTOR(S) : Yukio Yano

It is certified that error appears in the above-identified patent and that said Letters Patent is hereby corrected as shown below:

<u>Column 16,</u>
Line 42, "n⁻type" should read -- n⁻-type --.

<u>Column 18,</u>
Line 61, "claim 29," should read -- claim 19, --.
Line 63, "claim 29," should read -- claim 19, --.

Signed and Sealed this

Ninth Day of September, 2003

JAMES E. ROGAN
*Director of the United States Patent and Trademark Office*